US009666646B2

(12) United States Patent
Toya et al.

(10) Patent No.: US 9,666,646 B2
(45) Date of Patent: May 30, 2017

(54) LIGHT EMITTING ELEMENT DISPOSED IN A DISPLAY REGION OF A SUBSTRATE

(71) Applicant: SEIKO EPSON CORPORATION, Tokyo (JP)

(72) Inventors: Takashi Toya, Shimosuwa-machi (JP); Takeshi Koshihara, Matsumoto (JP); Naotaka Kubota, Chino (JP); Ryoichi Nozawa, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 125 days.

(21) Appl. No.: 14/509,460

(22) Filed: Oct. 8, 2014

(65) Prior Publication Data

US 2015/0102376 A1    Apr. 16, 2015

(30) Foreign Application Priority Data

Oct. 10, 2013  (JP) .................................. 2013-212403
Oct. 10, 2013  (JP) .................................. 2013-212404

(51) Int. Cl.
*H01L 27/32*    (2006.01)
*H01L 51/52*    (2006.01)

(52) U.S. Cl.
CPC ........ *H01L 27/322* (2013.01); *H01L 51/5246* (2013.01); *H01L 27/3248* (2013.01); *H01L 27/3258* (2013.01); *H01L 27/3272* (2013.01); *H01L 27/3276* (2013.01)

(58) Field of Classification Search
CPC ............... H01L 27/322; H01L 51/5246; H01L 27/3276; H01L 27/3248; H01L 27/3272; H01L 27/3258
See application file for complete search history.

(56) References Cited

U.S. PATENT DOCUMENTS

| | | |
|---|---|---|
| 5,910,829 A | 6/1999 | Shimada et al. |
| 6,552,488 B1 | 4/2003 | Roitman et al. |
| 2003/0230972 A1 | 12/2003 | Cok |
| 2004/0000864 A1 | 1/2004 | Kato |
| 2004/0017149 A1* | 1/2004 | Matsumoto .......... G09G 3/3233 313/500 |
| 2004/0027055 A1 | 2/2004 | Yamazaki et al. |
| 2004/0140762 A1 | 7/2004 | Tohma et al. |
| 2004/0227895 A1* | 11/2004 | Yoo .................... G02F 1/133516 349/152 |

(Continued)

FOREIGN PATENT DOCUMENTS

| | | |
|---|---|---|
| JP | H10062768 A | 3/1998 |
| JP | 2000029014 A | 1/2000 |

(Continued)

*Primary Examiner* — Ermias Woldegeorgis
(74) *Attorney, Agent, or Firm* — Oliff PLC

(57) ABSTRACT

A light-emitting device includes a light-emitting element disposed in a display region and including a first electrode, a second electrode, and a light-emitting functional layer. The light-emitting device includes a wiring formed in a periphery of the display region and that is electrically connected to the second electrode, and a filter layer having a first color filter that overlaps the light-emitting element and a first layer that overlaps the peripheral wiring. The first color filter and the first layer are formed from a first colored layer that transmits light having a first wavelength.

21 Claims, 15 Drawing Sheets

(56) References Cited

U.S. PATENT DOCUMENTS

| | | | |
|---|---|---|---|
| 2005/0067945 A1* | 3/2005 | Nishikawa | H01L 51/5265 |
| | | | 313/501 |
| 2005/0073230 A1* | 4/2005 | Nishikawa | H01L 27/3211 |
| | | | 313/111 |
| 2005/0088951 A1 | 4/2005 | Fukasawa et al. | |
| 2006/0012288 A1 | 1/2006 | Terakado et al. | |
| 2006/0097614 A1* | 5/2006 | Nakai | H01L 27/322 |
| | | | 313/112 |
| 2006/0187155 A1 | 8/2006 | Chang et al. | |
| 2008/0191603 A1 | 8/2008 | Kubota | |
| 2010/0164906 A1 | 7/2010 | Fukunaga et al. | |
| 2011/0284898 A1 | 11/2011 | Iwasaki | |
| 2012/0038267 A1 | 2/2012 | Hanamura et al. | |
| 2012/0187425 A1 | 7/2012 | Omoto | |
| 2013/0020934 A1 | 1/2013 | Iwasaki et al. | |
| 2013/0342927 A1 | 12/2013 | Hino et al. | |

FOREIGN PATENT DOCUMENTS

| | | |
|---|---|---|
| JP | A-2003-249362 | 9/2003 |
| JP | A-2004-022541 | 1/2004 |
| JP | A-2004-031215 | 1/2004 |
| JP | A-2004-094236 | 3/2004 |
| JP | A-2004-220874 | 8/2004 |
| JP | A-2006-032010 | 2/2006 |
| JP | A-2006-147528 | 6/2006 |
| JP | A-2006-215559 | 8/2006 |
| JP | A-2007-188853 | 7/2007 |
| JP | 2010-027265 A | 2/2010 |
| JP | A-2010-107841 | 5/2010 |
| JP | A-2010-152072 | 7/2010 |
| JP | A-2011-053339 | 3/2011 |
| JP | B-4768905 | 6/2011 |
| JP | A-2011-243525 | 12/2011 |
| JP | A-2012-018868 | 1/2012 |
| JP | A-2012-028058 | 2/2012 |
| JP | A-2012-038677 | 2/2012 |
| JP | A-2012-069256 | 4/2012 |
| JP | 2012142315 A | 7/2012 |
| JP | A-2012-155953 | 8/2012 |
| JP | A-2012-216454 | 11/2012 |
| JP | A-2013-020744 | 1/2013 |
| JP | A-2013-026064 | 2/2013 |
| JP | A-2013-045542 | 3/2013 |
| WO | WO 00/16938 | 3/2000 |
| WO | 2013008679 A1 | 1/2013 |

* cited by examiner

LIGHT EMITTING ELEMENT DISPOSED IN A DISPLAY REGION OF A SUBSTRATE

CROSS-REFERENCE TO RELATED APPLICATIONS

This application claims benefit of Japanese Applications JP 2013-212403 and 2013-212404, both filed on Oct. 10, 2013. The disclosures of the prior applications are hereby incorporated by reference herein in their entirety.

BACKGROUND

1. Technical Field

Various embodiments relate to a light-emitting device which uses a light-emitting material such as an organic electroluminescent (EL) material.

2. Related Art

A light-emitting device having light-emitting elements which use an organic EL material and are arranged on a display region of a substrate is hitherto suggested. The light-emitting element includes an anode electrode, a cathode electrode, and a light-emitting functional layer which emits light according to current between the two electrodes. A potential corresponding to the luminance for light emission is supplied to the anode electrode, and a lower power supply potential is supplied to the cathode electrode. In JP-A-2006-147528, a technique is disclosed in which the light-emitting element formed on the substrate is sealed by a sealing layer (a buffer layer or a gas barrier layer) to protect the light-emitting element from moisture or outside air. In JP-A-2010-107841, a light-emitting device is disclosed in which a power supply conductor (peripheral wiring) which is connected to the light-emitting element and supplies a power supply potential is formed in the periphery of a display region in a plan view.

However, in the technique of JP-A-2006-147528, there is a possibility that moisture and outside air may infiltrate into the boundary portion between the side end surface of the sealing layer and a base surface where the sealing layer is formed (for example, the surface of the substrate) and may reach the light-emitting element. In order to solve this problem, forming an element that blocks the boundary portion between the side end surface of the sealing layer and the base surface is considered. However, since an additional process of forming the element that blocks the boundary portion between the sealing layer and the base surface needs to be included, there is a problem in that the manufacturing process becomes complex.

In addition, there may be cases where light is incident on the periphery of the display region from the observation side. In the technique of JP-A-2010-107841, since the peripheral wiring is formed in the periphery of the display region in the plan view, incident external light is reflected by the surface of the peripheral wiring and is sensed by an observer (reflection of an object on the observation side is sensed). In order to solve this problem, forming a light-shielding member to overlap the peripheral wiring is considered. However, an additional process of forming the light-shielding member that overlaps the peripheral wiring needs to be included, and there is a problem in that the manufacturing process becomes complex.

SUMMARY

An advantage of one or more embodiments disclosed herein is that sufficient sealing performance is secured while suppressing an increase in the complexity of a manufacturing process. In addition, an advantage of one or more embodiments is that reflection light on the surface of a peripheral wiring is less likely to be sensed by an observer while suppressing an increase in the complexity of a manufacturing process.

According to one embodiment, a light-emitting device includes: a light-emitting element which is disposed in a display region and includes a first electrode, a second electrode, and a light-emitting functional layer that emits light according to current between the first electrode and the second electrode; a peripheral wiring which is formed in a periphery of the display region in a plan view and is electrically connected to the second electrode; and a filter layer having a first color filter which overlaps the light-emitting element and a first layer which overlaps the peripheral wiring, wherein the first color filter and the first layer are formed from a first colored layer that transmits light having a first wavelength. In this configuration, since the first layer and the peripheral wiring overlap each other, light that is directed to the peripheral wiring from the observation side or light reflected by the surface of the peripheral wiring are shielded by the first layer. Therefore, there is an advantage in that the light reflected by the surface of the peripheral wiring is less likely to be sensed by an observer. In addition, since both the first layer and the first color filter are formed in the first colored layer, the layers can be collectively formed during a common process. Therefore, compared to a case where the first layer is formed separately from a process of forming the first color filter, there is an advantage in that the manufacturing process is simplified.

In the light-emitting device, the filter layer may include a second color filter which overlaps the light-emitting element and a second layer which is formed on a surface of the first layer and overlaps the peripheral wiring, wherein the second color filter and the second layer are formed from a second colored layer that transmits light having a second wavelength that is different from the first wavelength. In this configuration, since the second layer and the first layer overlap the peripheral wiring, for example, compared to a configuration in which light is shielded by a single layer, light-shielding performance is enhanced. Therefore, an effect in which the light reflected by the surface of the peripheral wiring is less likely to be sensed by an observer becomes particularly significant. In addition, since both the second layer and the second color filter are formed in the second colored layer, the layers can be collectively formed during a common process. Therefore, compared to a case where the second layer is formed separately from a process of forming the second color filter, there is an advantage in that the manufacturing process is simplified.

In the light-emitting device, a peripheral edge of the second layer may be positioned on an inside of a peripheral edge of the first layer in the plan view. In this configuration, since the peripheral edge of the first layer and the peripheral edge of the second layer do not overlap each other in the plan view, the side surfaces of the first layer and the second layer are not formed to be aligned with each other. In a configuration in which the side surfaces of the first layer and the second layer are formed to be aligned with each other (that is, the peripheral edge of the second layer and the peripheral edge of the first layer overlap each other in the plan view), a height difference corresponding to the sum of the film thicknesses of the first layer and the second layer occurs on the surface of the filter layer. On the other hand, in the light-emitting device, a height difference corresponding to the film thickness of the first layer and a height difference corresponding to the film thickness of the second layer are individually formed, and thus the height difference formed in the surface of the filter layer is smaller than the sum of the film thicknesses of the first layer and the second layer. That is, compared to the configuration in which the side surfaces of the first layer and the second layer are formed to be aligned with each other, the surface of the filter layer is formed to be flattened.

In the light-emitting device, the filter layer may include a third color filter which overlaps the light-emitting element and a third layer which is formed on a surface of the second layer and overlaps the peripheral wiring, wherein the third color filter and the third layer are formed from a third colored layer which transmits light having a third wavelength that is different from the first and second wavelengths. In this configuration, since the first, second, and third layers overlap the peripheral wiring, for example, compared to a configuration in which light is shielded by a single layer or two layers, light-shielding performance is enhanced. Therefore, an effect in which the light reflected by the surface of the peripheral wiring is less likely to be sensed by an observer becomes particularly significant. In addition, since both the third layer and the third color filter are formed in the third colored layer, the layers can be collectively formed during a common process. Therefore, compared to a case where the third layer is formed separately from a process of forming the third color filter, there is an advantage in that the manufacturing process is simplified.

In the light-emitting device, a peripheral edge of the third layer may be positioned on an inside of a peripheral edge of the second layer in the plan view. In this configuration, a height difference corresponding to the film thickness of the second layer and a height difference corresponding to the film thickness of the third layer are individually formed on the surface of the filter layer. Therefore, compared to a configuration in which the peripheral edges of the second layer and the third layer overlap each other in the plan view (a configuration in which a height difference corresponding to the sum of the film thicknesses of the second layer and the third layer occurs on the surface of the filter layer), the surface of the filter layer may be flattened.

In the light-emitting device, the filter layer may include an insulating layer in which a plurality of first openings are formed in the display region and a second opening that overlaps the peripheral wiring is formed, the first, second, and third color filters may be formed on an inside of the plurality of first openings, and the first, second, and third layers may be formed on an inside of the second opening. In this configuration, the first, second, and third color filters are partitioned in the display region by the insulating layer. Since the first, second, and third layers are formed on the inside of the second opening formed in the insulating layer, compared to a configuration in which the first, second, and third layers are formed on the surface of the insulating layer, a height difference in the surface of the filter layer is less.

According to another embodiment, a light-emitting device includes: a light-emitting element disposed on a surface of a base body; a first sealing layer which includes a sealing surface that overlaps the light-emitting element and a side end surface that is positioned on an outside of the sealing surface in a plan view and is inclined with respect to the sealing surface, and seals the light-emitting element; and a filter layer having a first color filter which overlaps the light-emitting element and a first layer which overlaps a peripheral edge of the side end surface on the base body side, wherein the first color filter and the first layer are formed from a first colored layer that transmits light having a first wavelength. In this configuration, since the peripheral edge of the side end surface of the first sealing layer on the base body side (a part of the boundary between the first sealing layer and the base layer) overlaps the first layer, infiltration of moisture or outside air from the peripheral edge of the first sealing layer is prevented, thereby enhancing the sealing performance of the first sealing layer. In addition, since both the first layer and the first color filter are formed in the first colored layer, the layers can be collectively formed during a common process. Therefore, compared to a case where the first layer is formed separately from a process of forming the first color filter, there is an advantage in that the manufacturing process is simplified.

The light-emitting device may further include a second sealing layer which covers the first sealing layer. In the light-emitting device, since the first sealing layer is covered with the second sealing layer, compared to a configuration in which only the first sealing layer is formed, it is possible to more sufficiently secure sealing performance. In addition, a part of the second sealing layer which overlaps the peripheral edge of the side end surface of the first sealing layer on the sealing surface side tends to be more easily broken compared to a flat part of the second sealing layer on the surface of the sealing surface. Considering this circumstance, in an appropriate example of the configuration provided with the second sealing layer, the first layer is formed on the surface of the second sealing layer and overlaps the peripheral edge of the side end surface on the sealing surface side. In this configuration, the second sealing layer which overlaps the peripheral edge of the side end surface of the first sealing layer on the sealing surface side is protected by the first layer.

In a configuration in which wirings are formed in the periphery of the display region in the plan view, there is a problem in that when external light is incident onto the periphery of the display region, the light reflected by the surface of the wirings (reflection of an object on the observation side) is sensed by the observer. However, in the light-emitting device, the light-emitting element may be disposed in a display region and include a first electrode, a second electrode, and a light-emitting functional layer that emits light according to current between the first electrode and the second electrode, a peripheral wiring which is formed in a periphery of the display region in a plan view and is electrically connected to the second electrode may be further included, and the first layer may overlap the peripheral wiring. In this configuration, since the peripheral wiring overlaps the first layer, light that is directed to the peripheral wiring from the observation side or light reflected by the surface of the peripheral wiring is shielded by the first layer. Therefore, there is an advantage in that the light reflected by the surface of the peripheral wiring is less likely to be sensed by the observer.

In the light-emitting device, the filter layer may include a second color filter which overlaps the light-emitting element and a second layer which overlaps the first layer, wherein the second color filter and the second layer are formed from a second colored layer that transmits light having a second wavelength that is different from the first wavelength. In this configuration, since the second layer overlaps the first layer, the first layer is protected by the second layer. In addition, since both the second layer and the second color filter are formed in the second colored layer, the layers can be collectively formed during a common process. Therefore, compared to a case where the second layer is formed separately from a process of forming the second color filter, there is an advantage in that the manufacturing process is simplified.

In the light-emitting device, the filter layer may include a third color filter which overlaps the light-emitting element and a third layer which overlaps the second layer, wherein the third color filter and the third layer are formed from a third colored layer which transmits light having a third wavelength that is different from the first and second wavelengths. In this configuration, since the first, second, and third layers are protected from external forces, an effect of protecting the first layer becomes particularly significant. In addition, since both the third layer and the third color filter are formed in the third colored layer, the layers can be collectively formed during a common process. Therefore, compared to a case where the third layer is formed separately from a process of forming the third color filter, there is an advantage in that the manufacturing process is simplified.

According to still another embodiment, a light-emitting device includes: a light-emitting element disposed on a surface of a base body; a first sealing layer which includes a sealing surface that overlaps the light-emitting element and a side end surface that is positioned on an outside of the sealing surface in a plan view and is inclined with respect to the sealing surface, and seals the light-emitting element; a second sealing layer having a first color filter which overlaps the light-emitting element on a surface of the second sealing layer and a first layer which overlaps a peripheral edge of the side end surface on the sealing surface side on a surface of the second sealing layer, wherein the first color filter and the first layer are formed from a first colored layer that transmits light having a first wavelength. In this configuration, the second sealing layer that overlaps the peripheral edge of the side end surface of the first sealing layer on the sealing surface side is protected by the first layer. In addition, compared to a case where the first layer is formed separately from a process of forming the first color filter, there is an advantage in that the manufacturing process is simplified.

The light-emitting device according to the above aspects is used in various types of electronic apparatuses as, for example, a display device. Specifically, a head mounted display device, an electronic view finder of an imaging device, or the like may be exemplified as an appropriate example of the electronic apparatus of one or more embodiments. However, the application range of the various embodiments is not limited to the above examples.

BRIEF DESCRIPTION OF THE DRAWINGS

The various embodiments will be described with reference to the accompanying drawings, wherein like numbers reference like elements.

DESCRIPTION OF EXEMPLARY EMBODIMENTS

First Embodiment

Figure 1:
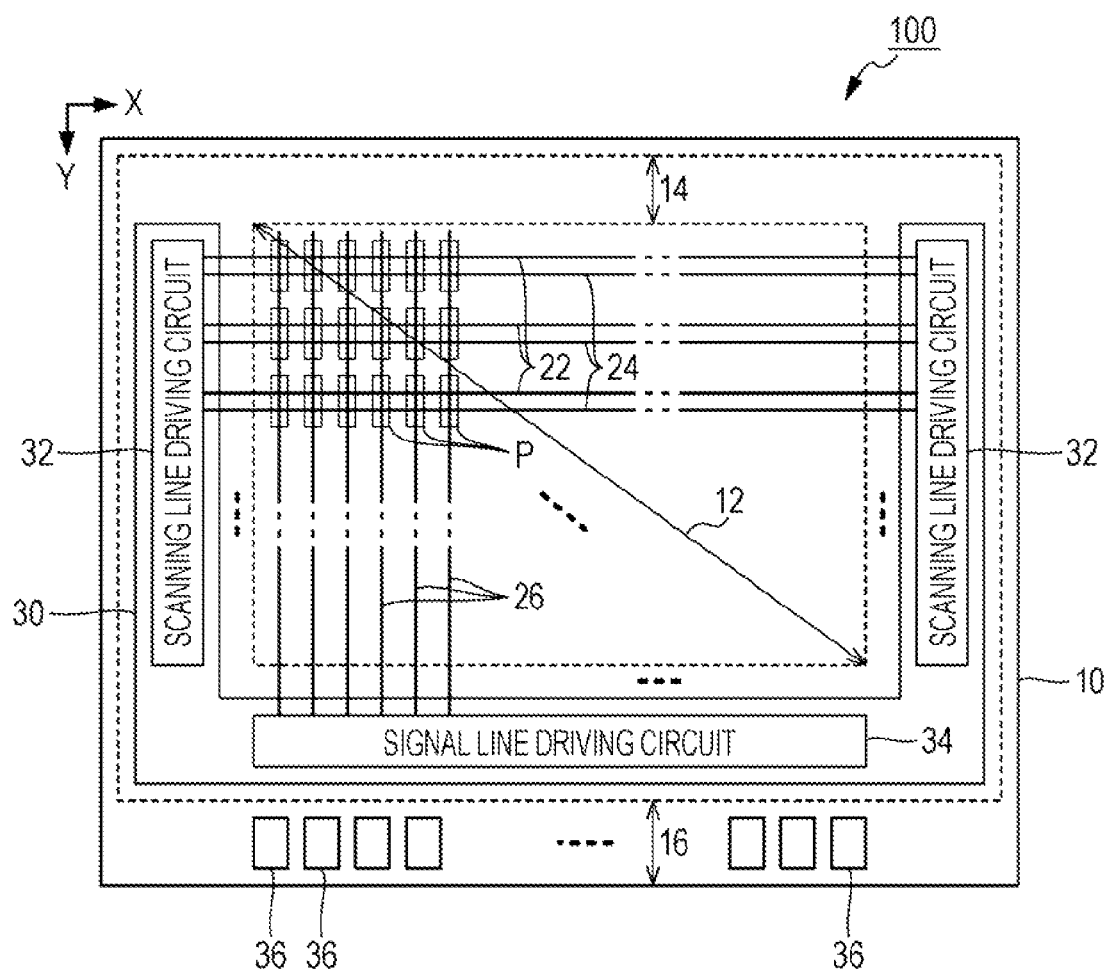
FIG. 1 is a plan view of a light-emitting device according to a first embodiment.

FIG. 1 is a plan view of a light-emitting device 100 according to a first embodiment. The light-emitting device 100 of the first embodiment is an organic EL device in which light-emitting elements that use an organic EL material are formed on the surface of a substrate 10. The substrate 10 is a plate-like member (semiconductor substrate) formed of a semiconductor material such as silicon and is used as a base body (base) on which a plurality of light-emitting elements are formed.

As exemplified in FIG. 1, a display region 12, a peripheral region 14, and a mounting region 16 are demarcated on the surface of the substrate 10. The display region 12 is a rectangular region in which a plurality of pixels P are arranged. In the display region 12, a plurality of scanning lines 22 that extend in an X direction, a plurality of control lines 24 that extend in the X direction to respectively correspond to the scanning lines 22, and a plurality of signal lines 26 that extend in a Y direction intersecting the X direction are formed. The pixels P are formed at the intersections between the plurality of scanning lines 22 and the plurality of signal lines 26. Therefore, the plurality of pixels P are arranged in a matrix form along the X direction and the Y direction.

The peripheral region 14 is a rectangular frame-shaped region which surrounds the display region 12. A driving circuit 30 is installed on the peripheral region 14. The driving circuit 30 is a circuit that drives each pixel P in the display region 12 and is configured to include two scanning line driving circuits 32 and a signal line driving circuit 34. The light-emitting device 100 of the first embodiment is a circuit built-in type display device in which the driving circuit. 30 is formed of active elements such as transistors and the like directly formed on the surface of the substrate 10. In addition, dummy pixels that do not directly contribute to image display may be formed in the peripheral region 14.

The mounting region 16 is a region on the opposite side to the display region 12 with the peripheral region 14 interposed therebetween (that is, on the outside of the peripheral region 14), and a plurality of mounting terminals 36 are arranged on the mounting region 16. Control signals or power supply potentials are supplied to the corresponding mounting terminals 36 from various types of external circuits (not illustrated) such as a control circuit or a power supply circuit. The external circuits are mounted on, for example, a flexible wiring substrate (not illustrated) joined to the mounting region 16.

Figure 2:
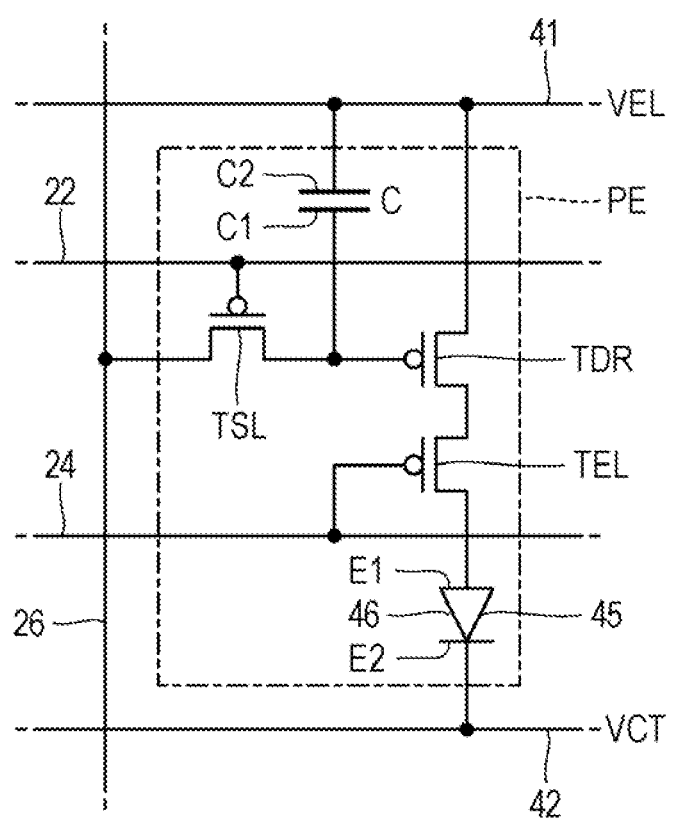
FIG. 2 is a circuit diagram of pixels.

FIG. 2 is a circuit diagram of each pixel (pixel circuit.) P in the display region 12. As exemplified in FIG. 2, the pixel P is configured to include a light-emitting element 45, a driving transistor TDR, a light emission control transistor TEL, a selection transistor TSL, and a capacitive element C. In the first embodiment, the transistors T (TDR, TEL, and TSL) of the pixel P have a P-channel type, but N-channel type transistors may also be used.

The light-emitting element 45 is an electro-optical element in which a light-emitting functional layer 46 including a light-emitting layer made of an organic EL material is interposed between a first electrode (anode) E1 and a second electrode (cathode) E2. The first electrode E1 is formed individually in each of the pixels P, and the second electrode E2 is continuous over the plurality of pixels P. As understood by FIG. 2, the light-emitting element 45 is disposed on a current path that connects a first power supply conductor 41 to a second power supply conductor 42. The first power supply conductor 41 is a power supply wiring to which a higher power supply potential (first potential) VEL is supplied, and the second power supply conductor 42 is a power supply wiring to which a lower power supply potential (second potential) VCT is supplied.

The driving transistor TDR and the light emission control transistor TEL are arranged in series with the light-emitting element 45 on the current path that connects the first power supply conductor 41 to the second power supply conductor 42. Specifically, one (source) of a pair of current ends of the driving transistor TDR is connected to the first power supply conductor 41. The light emission control transistor TEL functions as a switch that controls a conduction state (conducted/non-conducted) between the other (drain) of the pair of current ends of the driving transistor TDR and the first electrode E1 of the light-emitting element 45. The driving transistor TDR generates driving current having a current amount corresponding to a gate-source voltage thereof. In a state where the light emission control transistor TEL is controlled to be in an ON state, the driving current is supplied to the light-emitting element 45 from the driving transistor TDR via the light emission control transistor TEL such that the light-emitting element 45 emits light at a luminance corresponding to the current amount of the driving current. In a state where the light emission control transistor TEL is controlled to be in an OFF state, the supply of the driving current to the light-emitting element 45 is blocked such that the light-emitting element 45 is turned off. The gate of the light emission control transistor TEL is connected to the control line 24.

The selection transistor TSL of FIG. 2 functions as a switch that controls a conduction state (conducted/non-conducted) between the signal line 26 and the gate of the driving transistor TDR. The gate of the selection transistor TSL is connected to the scanning line 22. The capacitive element C is an electrostatic capacitance having a dielectric interposed between the first electrode C1 and the second electrode C2. The first electrode C1 is connected to the gate of the driving transistor TDR, and the second electrode C2 is connected to the first power supply conductor 41 (the source of the driving transistor TDR). Therefore, the capacitive element C holds the gate-source voltage of the driving transistor TDR.

The signal line driving circuit 34 supplies a gradation potential (data signal) corresponding to a gradation designated for each pixel P by an image signal supplied from the external circuit to the plurality of signal lines 26 in parallel in each wiring period (horizontal scanning period). Each scanning line driving circuit 32 sequentially selects the plurality of scanning lines 22 in each writing period by supplying a scanning signal to each of the scanning lines 22. The selection transistor TSL of each pixel P corresponding to the scanning line 22 selected by the scanning line driving circuit 32 is transited to an ON state. Therefore, the gradation potential is supplied to the gate of the driving transistor TDR of each pixel P via the signal line 26 and the selection transistor TSL, and a voltage corresponding to the gradation potential is held in the capacitive element C. When the selection of the scanning line 22 in the writing period is ended, each scanning line driving circuit 32 supplies the control signal to the control line 24 to control the light emission control transistor TEL of each pixel P corresponding to the control line 24 to be in the ON state. Therefore, the driving current corresponding to the voltage held in the capacitive element C in the preceding writing period is supplied to the light-emitting element 45 from the driving transistor TDR via the light emission control transistor TEL. As described above, as each light-emitting element 45 emits light at a luminance corresponding to the gradation potential, an arbitrary image designated by the image signal is displayed on the display region 12.

Figure 3:
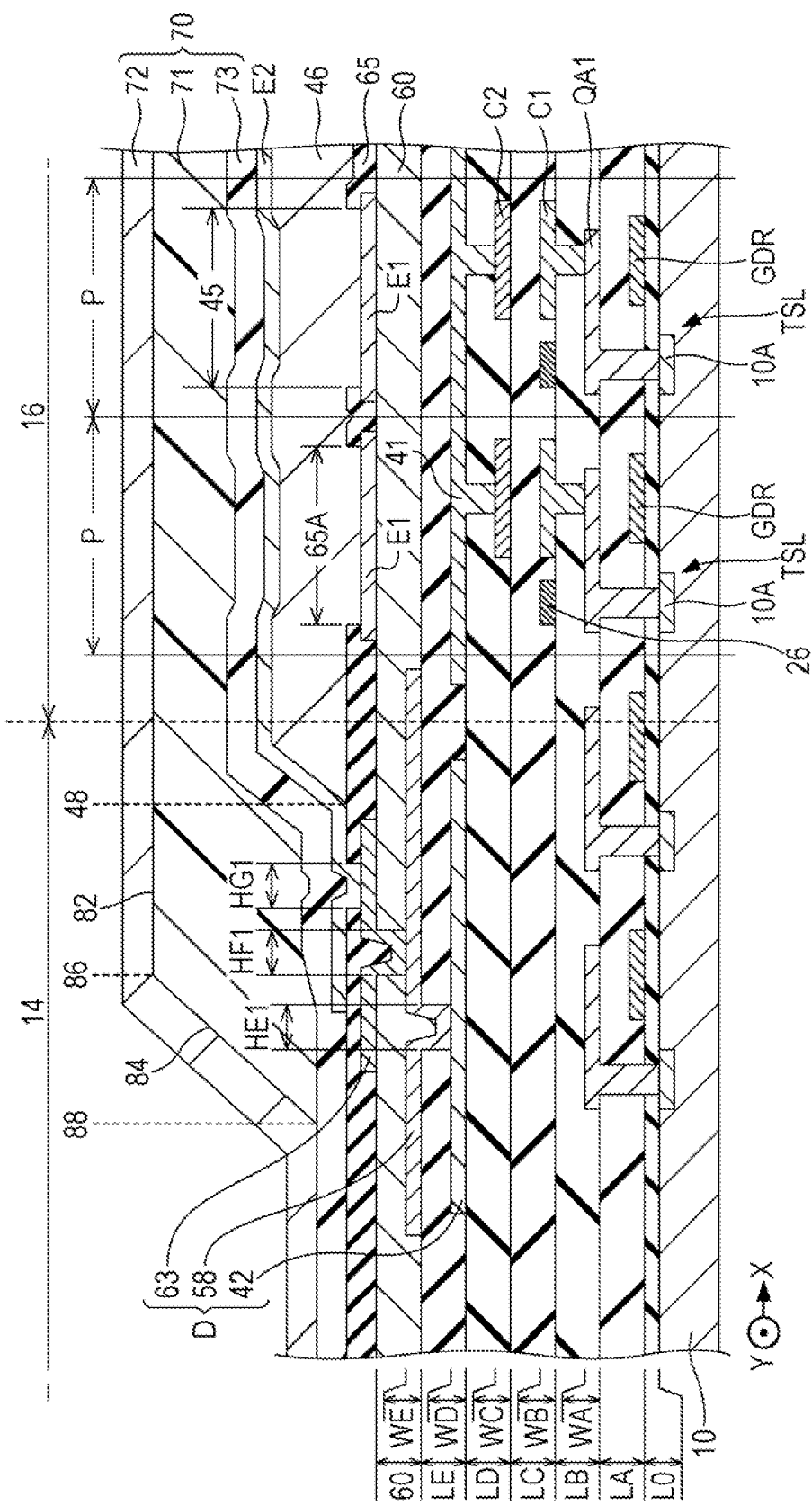
FIG. 3 is a cross-sectional view of the light-emitting device.
Figure 4:
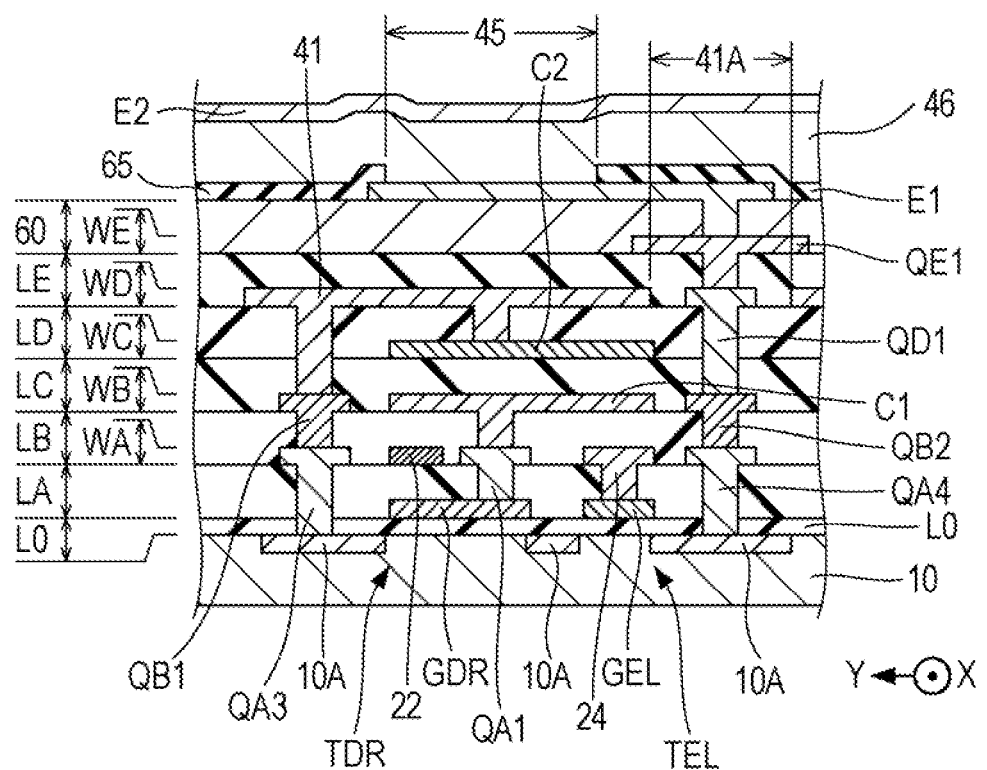
FIG. 4 is a cross-sectional view of the light-emitting device.

An exemplary structure of the light-emitting device 100 of the first embodiment will be described as follows. In each figure referred to in the following description, for ease of description, the dimensions and scales of each element differ from those of an actual light-emitting device 100 and may vary relative to each other differently than illustrated. FIGS. 3 and 4 are cross-sectional views of the light-emitting device 100, and FIGS. 5 to 9 are plan views illustrating the form of the surface of the substrate 10 focusing on a part corresponding to the signal pixel P, in stages in which the elements of the light-emitting device 100 are formed. Cross-sectional views corresponding to the cross-sections taken along line III-III of FIGS. 5 to 9 correspond to FIG. 3, and cross-sectional views corresponding to the cross-sections taken along line IV-IV of FIGS. 5 to 9 correspond to FIG. 4. In addition, although the FIGS. 5 to 9 are plan views, from the viewpoint of ease of visual perception of each element, common elements in FIGS. 3 and 4 are provided with the same hatching in FIGS. 3 and 4 for convenience.

Figure 5:
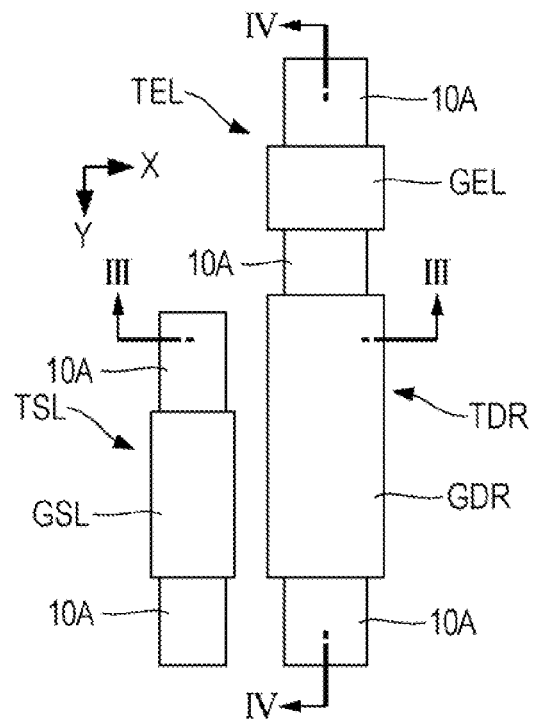
FIG. 5 is an illustration of elements formed on a substrate.

As understood from FIGS. 3 to 5, on the substrate 10 formed of a semiconductor material such as silicon, active regions 10A (source/drain regions) of the transistors T (TDR, TEL, and TSL) of the pixels P are formed. Ions are implanted into the active regions 10A. The active layer of each of the transistors T (TDR, TEL, and TSL) of the pixel P is present between the source region and the drain region, and a different type of ions from those of the active region 10A are implanted into the active layer. Illustration thereof is omitted for convenience. As exemplified in FIGS. 3 and 4, the surface of the substrate 10 where the active regions 10A are formed is covered with an insulating film L0 (gate insulating film), and gates G (GDR, GEL, and GSL) of the transistors T are formed on the surface of the insulating film L0. The gate G of each transistor T opposes the active layer with the insulating film L0 interposed therebetween. In FIG. 4, the gate GSL of the selection transistor TSL, the gate GDR of the driving transistor TDR, and the gate GEL of the light emission control transistor TEL are illustrated.

As understood from FIGS. 3 and 4, on the surface of the insulating film L0 where the gates G of the transistors T are formed, a multilayer wiring layer in which a plurality of insulating layers L (LA to LE) and a plurality of wiring layers W (WA to WE) are alternately stacked is formed. Each wiring layer W is formed of a conductive material having a low resistance, for example a material containing aluminum, silver, or the like. Each insulating layer L is formed of an inorganic insulating material such as a silicon compound (typically, silicon nitride or silicon oxide). In the following description, a relationship in which a plurality of elements are collectively formed in the same process by selectively removing a conductive layer (a single layer or a plurality of layers) is described as "formed from the same layer".

The insulating layer LA is formed on the surface of the insulating film L0 where the gates G of the transistors T are formed. As understood from FIGS. 3, 4, and 6, on the surface of the insulating layer LA, a conductor pattern including the scanning line 22, the control line 24, and a plurality of relay electrodes QA (QA1, QA2, QA3, and QA4) is formed from the same layer (the wiring layer WA). The scanning line 22 and the control line 24 linearly extend in the X direction over the plurality of pixels P at an interval therebetween. Specifically, as exemplified in FIG. 6, the scanning line 22 is formed to pass through the upper side of the gate GSL of the selection transistor TSL and the upper side of the gate GDR of the driving transistor TDR and is electrically connected to the gate GSL of the selection transistor TSL via a conduction hole (contact hole) HA1 that penetrates through the insulating layer LA. The conduction hole HA1 is formed to overlap the gate GSL of the selection transistor TSL and the active layer in the plan view. On the other hand, the control line 24 is formed to pass through the upper side of the gate GEL of the light emission control transistor TEL and is electrically connected to the gate GEL of the light emission control transistor TEL via a conduction hole HA2 that penetrates through the insulating layer LA. The conduction hole HA2 is formed to overlap the gate GEL of the light emission control transistor TEL and the active layer in the plan view.

Figure 6:
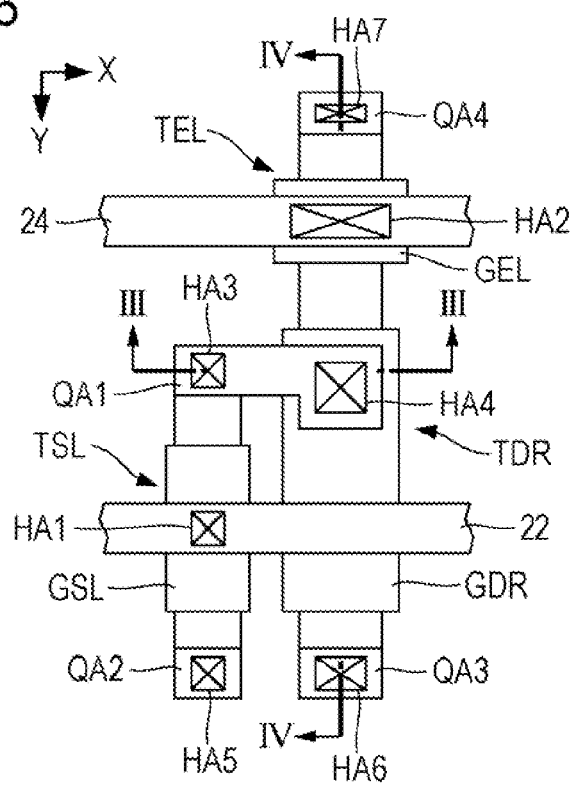
FIG. 6 is an illustration of elements formed on the substrate.

The relay electrode QA1 is a wiring that connects the active region 10A of the selection transistor TSL to the gate GDR of the driving transistor TDR and as exemplified in FIG. 6, is positioned between the scanning line 22 and the control line 24 in the plan view. Specifically, as understood from FIGS. 4 and 6, the relay electrode QA1 is electrically connected the active region 10A of the selection transistor TSL via a conduction hole HA3 that penetrates through the insulating layer LA and the insulating film L0, and is electrically connected to the gate GDR of the driving transistor TDR via a conduction hole HA4 of the insulating layer LA. In addition, as understood from FIG. 6, the relay electrode QA2 is electrically connected to the active region 10A of the selection transistor TSL via a conduction hole HA5 that penetrates through the insulating layer LA and the insulating film L0. The relay electrode QA3 is electrically connected to the active region 10A (source) of the driving transistor TDR via a conduction hole HA6 that penetrates through the insulating layer LA and the insulating film L0. The relay electrode QA4 is electrically connected to the active region 10A (drain) of the light emission control transistor TEL via a conduction hole HA7 that penetrates through the insulating layer LA and the insulating film L0. As understood from FIG. 6, each of the selection transistor TSL, the driving transistor TDR, and the light emission control transistor TEL is formed so that the channel length thereof follows the Y direction. In addition, the driving transistor TDR and the light emission control transistor TEL are arranged along the Y direction, and the selection transistor TSL is disposed at a position shifted in the X direction (in FIG. 6, the negative side of the X direction) from the driving transistor TDR and the light emission control transistor TEL.

Figure 7:
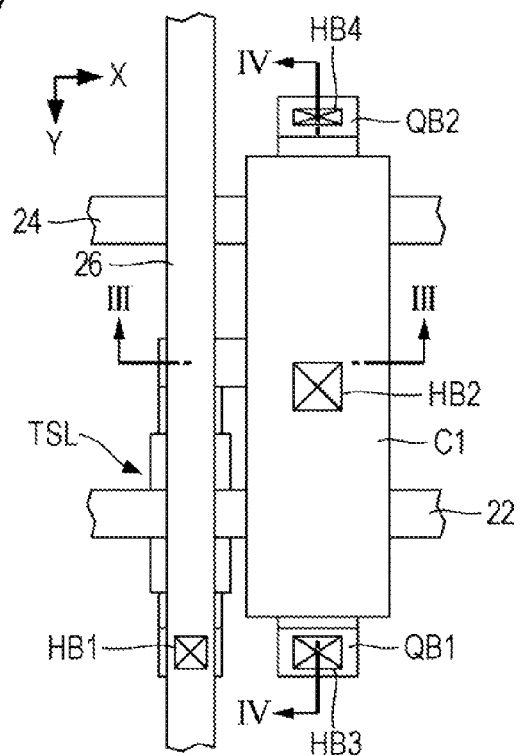
FIG. 7 is an illustration of elements formed on the substrate.
Figure 8:
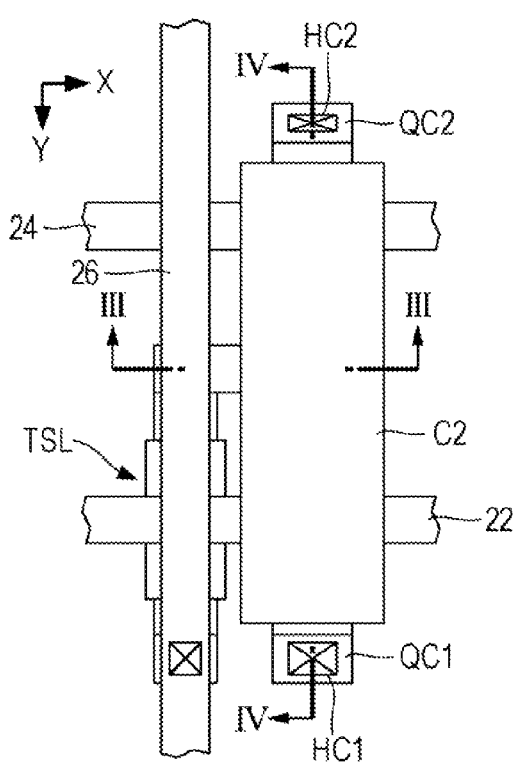
FIG. 8 is an illustration of elements formed on the substrate.

The insulating layer LB is formed on the surface of the insulating layer LA where the wiring layer WA is formed. As understood from FIGS. 3, 4, and 7, on the surface of the insulating layer LB, a conductor pattern including the signal line 26, the first electrode C1, and a plurality of relay electrodes QB (QB1 and QB2) is formed from the same layer (the wiring layer WB). The signal line 26 linearly extends in the Y direction over the plurality of pixels P and is electrically insulated from the scanning line 22 and the control line 24 by the insulating layer LA. Specifically, the signal line 26 is formed to pass through the upper sides of the active region 10A (source and drain) of the selection transistor TSL and the active layer and through the upper side of the relay electrode QA1 that is electrically connected to the gate GDR of the driving transistor TDR, extends along the direction of the channel length (Y direction) of the selection transistor TSL, and overlaps the selection transistor TSL in the plan view. In addition, the signal line 26 is formed in the upper layer higher than the active region 10A (source and drain) of each of the transistors (TDR, TEL, and TSL) and the gate G of each of the transistors T. As understood from FIG. 7, the signal line 26 of the wiring layer WB is electrically connected to the relay electrode QA2 of the wiring layer WA via a conduction hole HB1 that penetrates through the insulating layer LB. That is, the signal line 26 and the active region 10A (source) of the selection transistor TSL are connected to each other via the relay electrode QA2. The first electrode C1 of the wiring layer WB of FIG. 7 is electrically connected to the relay electrode QA1 of the wiring layer WA via a conduction hole HB2 that penetrates through the insulating layer LB. That is, the first electrode C1 of the capacitive element C is connected to the gate GDR of the driving transistor TDR via the relay electrode QA1. The relay electrode QB1 of the wiring layer WB of FIG. 7 is electrically connected to the relay electrode QA3 of the wiring layer WA via a conduction hole HB3 of the insulating layer LB, and the relay electrode QB2 of the wiring layer WB is electrically connected to the relay electrode QA4 of the wiring layer WA via a conduction hole HB4 of the insulating layer LB.

The insulating layer LC is formed on the surface of the insulating layer LB where the wiring layer WB is formed. As understood from FIGS. 3, 4, and 8, on the surface of the insulating layer LC, a conductor pattern including the second electrode C2 is formed from the same layer (the wiring layer WC). The second electrode C2 is formed to have a shape and a position that overlap the first electrode C1 in the plan view (that is, in a state viewed in a direction perpendicular to the surface of the substrate 10). As understood from FIG. 3, the capacitive element C is constituted by the first electrode C1, the second electrode C2, and the insulating layer LC therebetween. As exemplified in FIG. 8, the capacitive element C (the first electrode C1 and the second electrode C2) is installed to overlap the driving transistor TDR and the light emission control transistor TEL in the plan view.

As exemplified in FIGS. 3 and 4, the insulating layer LD is formed on the surface of the insulating layer LC where the wiring layer WC is formed. A planarization treatment is performed on the surface of the insulating layer LD. As the planarization treatment, surface treatment techniques known in the art, such as chemical mechanical polishing (CMP) may be employed. On the surface of the insulating layer LD that is planarized to a high degree by the planarization treatment, as exemplified in FIGS. 3 and 4, a conductor pattern including the first power supply conductor 41, the second power supply conductor 42, and a relay electrode QD1 is formed from the same layer (the wiring layer WD). As illustrated in FIG. 3, the first power supply conductor 41 and the second power supply conductor 42 are formed to be separated from each other and are electrically insulated from each other. The first power supply conductor 41 is electrically connected to the mounting terminal 36 to which the higher power supply potential VEL is supplied, via the wiring (not illustrated) in the multilayer wiring layer. Similarly, the second power supply conductor 42 is electrically connected to the mounting terminal 36 to which the lower power supply potential VCT is supplied, via the wiring (not illustrated) in the multilayer wiring layer. The first power supply conductor 41 and the second power supply conductor 42 of the first embodiment are formed of a light-reflective conductive material containing, for example, silver or aluminum to have film thicknesses of, for example, about 100 nm. However, other thicknesses that are greater or lesser than 100 nm are contemplated and within the scope of this disclosure.

Figure 10:
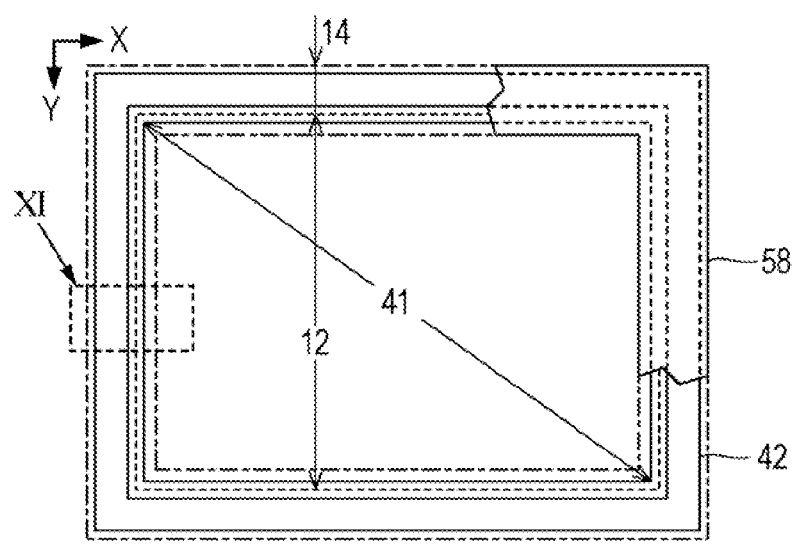
FIG. 10 is a schematic view of a first power supply conductor and a second power supply conductor.

FIG. 10 is a plan view of the first power supply conductor 41 and the second power supply conductor 42. The first power supply conductor 41 is the power supply wiring to which the higher power supply potential VEL is supplied as described above, and as exemplified in FIG. 10, has a solid pattern having a substantially rectangular shape formed over almost the entire surface of the display region 12. The solid pattern is not a line-shaped or band-like pattern or a combination thereof (for example, a lattice form) and means a surface-like (that is, solid) pattern that is uniformly continuous with substantially no gap so as to cover almost the entire surface of the display region 12. The first power supply conductor 41 may be individually formed in each pixel P.

Figure 9:
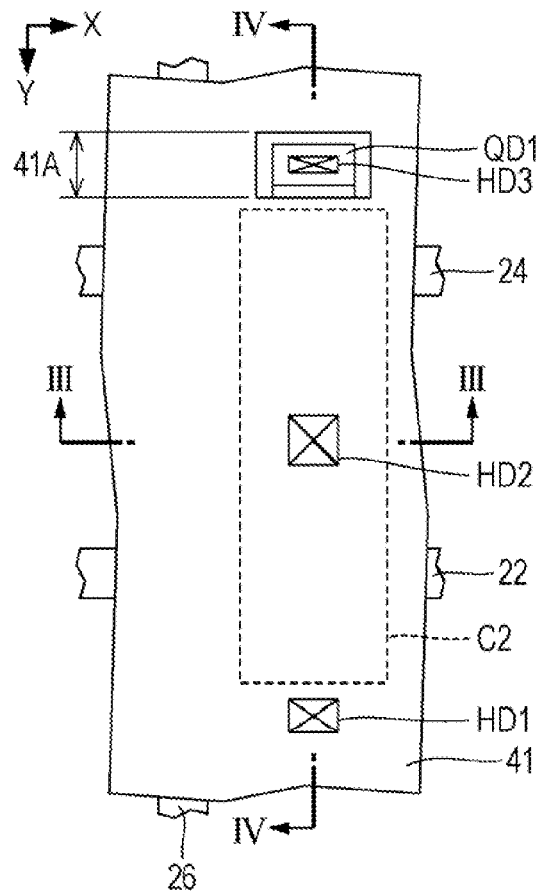
FIG. 9 is an illustration of elements formed on the substrate.

As understood from FIGS. 4 and 9, the first power supply conductor 41 formed in the display region 12 is electrically connected to the relay electrode QA3 via a conduction hole HD1 that penetrates through the insulating layer LD and the insulating layer LC in each pixel P. That is, as understood from FIG. 4, the active region 10A that functions as the source of the driving transistor TDR is connected to the first power supply conductor 41 via the relay electrode QA3 and the relay electrode QB1. In addition, as exemplified in FIG. 9, the first power supply conductor 41 is connected to the second electrode C2 of the capacitive element C via a conduction hole HD2 of the insulating layer LD. That is, the capacitive element C is interposed between the gate GDR and the source (the first power supply conductor 41) of the driving transistor TDR. In addition, a plurality of conduction holes HD2 may be formed in the insulating layer LD so that the first power supply conductor 41 and the second electrode C2 of the capacitive element C are connected at a plurality of points.

As exemplified in FIG. 9, the first power supply conductor 41 has an opening 41A formed in each pixel P. In each opening 41A, the relay electrode QD1 is formed from the same layer as the first power supply conductor 41 and the second power supply conductor 42. The relay electrode QD1 is formed to be separated from the first power supply conductor 41 and is electrically insulated therefrom. As understood from FIGS. 4 and 9, the relay electrode QD1 is electrically connected to the relay electrode QB2 via a conduction hole HD3 that penetrates through the insulating layer LD and the insulating layer LC. In addition, when it is assumed that an area obtained by dividing the area of the display region 12 by the total number of pixels P in the display region 12 is the area of a single pixel P, the area of each opening 41A is formed to be equal to or smaller than 20% of the area of each pixel P. For example, in a configuration in which the pixel P is formed in a rectangular shape having dimensions of a width of 2.5 μm×a height of 7.5 μm, the opening 41A is formed to have dimensions of a width of 0.9 μm×a height of 0.9 μm (an area of about 4% of the pixel P). However, other dimensions are contemplated and within the scope of this disclosure.

The second power supply conductor 42 is formed in the peripheral region 14 and is the power supply wiring to which the lower power supply potential VCT is supplied as described above. As exemplified in FIG. 10, the second power supply conductor 42 of this embodiment is formed in a rectangular frame shape (closed figure) which surrounds the first power supply conductor 41 (the display region 12) in the plan view. The width (distance from inner peripheral edge to outer peripheral edge) of the second power supply conductor 42 is, for example, 1.5 mm. However, different widths may be provided. FIGS. 11A to 11D are explanatory views of the positional relationship between the elements formed on the surface of the insulating layer LD. An enlarged view of a region XI in FIG. 10 corresponds to FIGS. 11A to 11D. As perceived from FIG. 10 and FIGS. 11A to 11D, the boundary between the display region 12 and the peripheral region 14 is positioned in a region enclosed by the peripheral edge of the first power supply conductor 41 and the inner peripheral edge of the second power supply conductor 42 in the plan view.

As exemplified in FIGS. 3 and 4, the insulating layer LE is formed on the surface of the insulating layer LD where the wiring layer WD is formed. On the surface of the insulating layer LE, a conductor pattern including a second conductor 58 illustrated in FIG. 3 and a relay electrode QE1 illustrated in FIG. 4 is formed from the same layer (the wiring layer WE). The wiring layer WE is formed of, for example, a light-shielding conductive material (for example, titanium nitride). However, other materials may be used.

The relay electrode QE1 is electrically connected to the relay electrode QD1 via a conduction hole that penetrates through the insulating layer LE. As understood from FIG. 4, the relay electrode QE1 is formed to overlap the opening 41A of the first power supply conductor 41 in the plan view. That is, the outer peripheral edge of the relay electrode QE1 is positioned outside the inner peripheral edge of the opening 41A in the plan view. Since the relay electrode QE1 is formed of the light-shielding conductive material, infiltration of external light from the opening 41A into the multilayer wiring layer is prevented by the relay electrode QE1. Therefore, the relay electrode QE1 functions as a light-shielding layer and has an advantage in that current leakage from each of the transistors T due to light illumination can be prevented.

Figure 11:
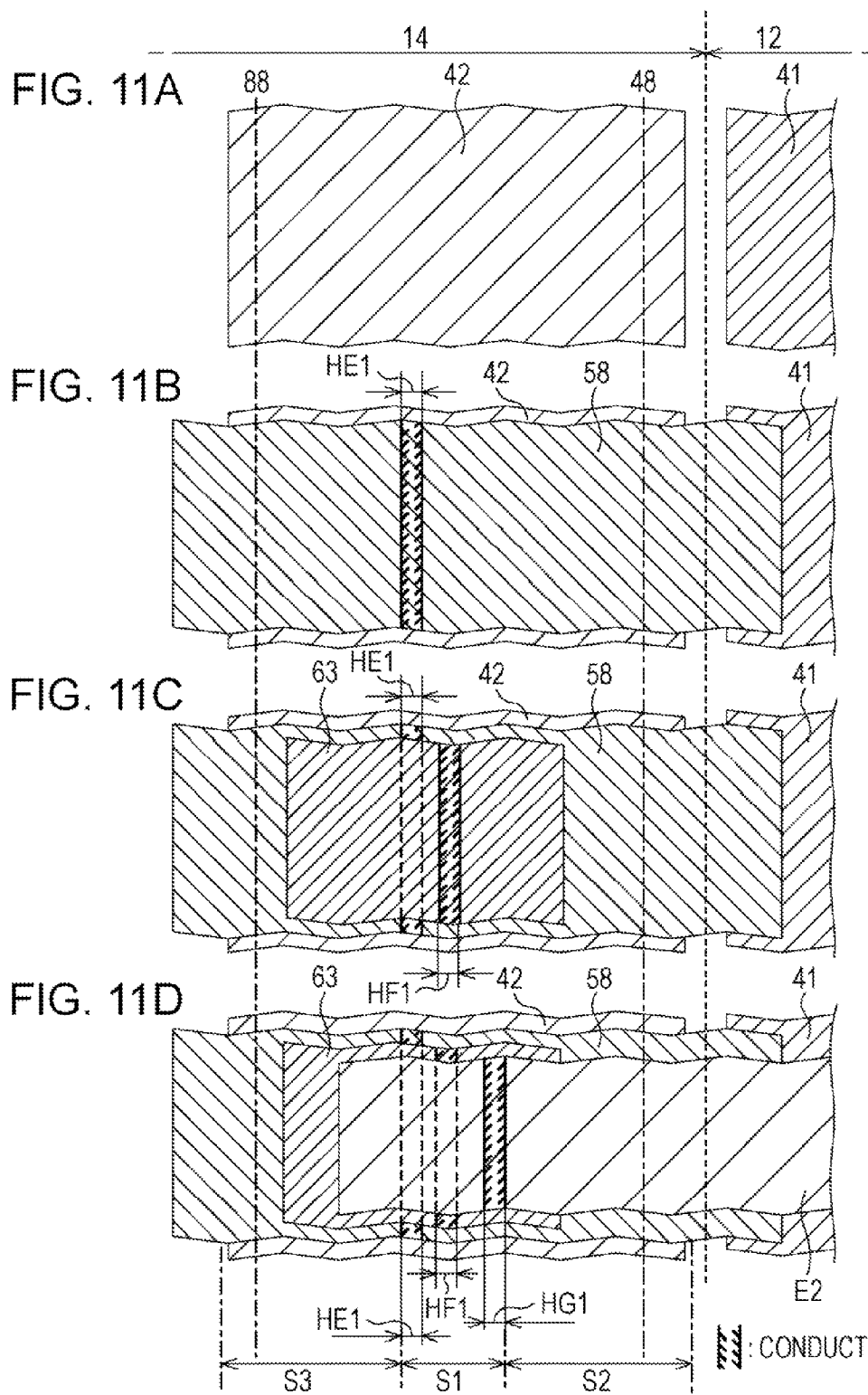
FIGS. 11A to 11D are illustrations of the positional relationship between the elements formed on the substrate.

The second conductor 58 is, as illustrated in FIGS. 10 and 11B, formed on the surfaces of the first power supply conductor 41 and the second power supply conductor 42. In FIG. 10, a portion of the second conductor 58 is illustrated by a solid line and the external form of the other portion thereof is expressed by a dashed line. As understood from FIG. 10, the second conductor 58 is formed in an annular shape (rectangular frame shape) that is similar to the second power supply conductor 42 and is formed in a band shape that overlaps both the first power supply conductor 41 and the second power supply conductor 42 in the plan view. Specifically, the inner peripheral edge of the second conductor 58 is positioned inside the peripheral edge of the first power supply conductor 41 in the plan view. That is, the second conductor 58 overlaps a region of the first power supply conductor 41 in the vicinity of the peripheral edge thereof. In addition, the outer peripheral edge of the second conductor 58 is positioned outside the outer peripheral, edge of the second power supply conductor 42 in the plan view. That is, the second conductor 58 overlaps the entire region of the second power supply conductor 42 in the plan view. As understood from the above description, the second conductor 58 overlaps the region of the gap (that is, a region in the vicinity of the boundary between the display region 12 and the peripheral region 14) between the first power supply conductor 41 and the second power supply conductor 42 in the plan view.

Figure 12:
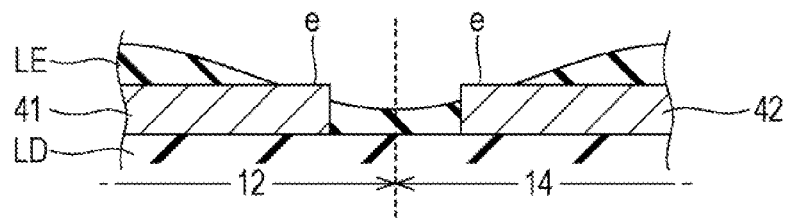
FIG. 12 is an illustration of an effect of a second conductor.

A configuration in which the second conductor 58 is not formed is postulated as a comparative example (hereinafter, referred to as "Comparative Example 1"). FIG. 12 is a cross-sectional view of the first power supply conductor 41 and the second power supply conductor 42 in Comparative Example 1 (a cross-sectional view in the vicinity of the boundary between the display region 12 and the peripheral region 14). As exemplified in FIG. 12, in Comparative Example 1, after forming the insulating layer LE that covers the first power supply conductor 41 and the second power supply conductor 42, edge end portions (corner portions) e of the first power supply conductor 41 and the second power supply conductor 42 are exposed from the insulating layer LE such that there is a possibility that damage or corrosion may occur in the first power supply conductor 41 or the second power supply conductor 42. On the other hand, in the first embodiment, since the second conductor 58 is formed to overlap the gap between the first power supply conductor 41 and the second power supply conductor 42 (cover the edge end portions e of the first power supply conductor 41 or the second power supply conductor 42), there is an advantage in that damage or corrosion of the first power supply conductor 41 and the second power supply conductor 42 caused by the exposure from the insulating layer LE can be prevented.

Figure 13:
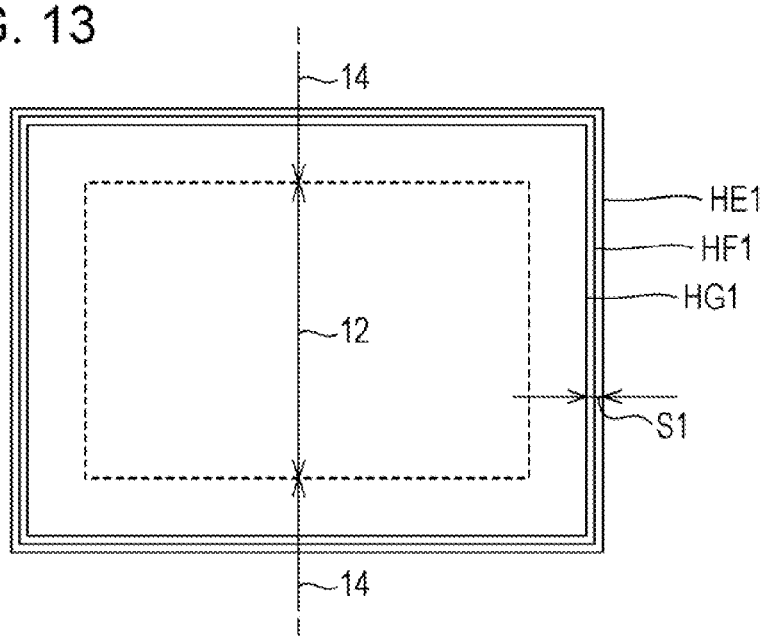
FIG. 13 is a plan view of conduction holes formed in a peripheral region.

As illustrated in FIGS. 3 and 11B, the second conductor 58 is electrically connected to the second power supply conductor 42 via a conduction hole HE1 that penetrates through the insulating layer LE. FIG. 13 is a plan view of conduction holes (HE1, HF1, and HG1) formed in the peripheral region 14. As illustrated in FIG. 13, the conduction hole HE1 is a through-hole formed by removing a rectangular frame-shaped region that surrounds the display region 12 from the insulating layer LE in the plan view. The conduction hole HE1 is formed in a first region S1 in the region that overlaps the second power supply conductor 42 in the plan view. The first region S1 is a rectangular frame-shaped region in the plan view as illustrated in FIG. 13, and as illustrated in FIG. 11D, is positioned between the inner peripheral edge and the outer peripheral edge of the second power supply conductor 42 in the peripheral region 14. The width of the first region S1 (the distance from the inner peripheral edge to the outer peripheral edge) is, for example, 0.3 mm. The second conductor 58 is electrically connected to the second power supply conductor 42 via the conduction hole HE1 over the entire periphery of the peripheral region 14.

As exemplified in FIGS. 3 and 4, on the surface of the insulating layer LE where the wiring layer WE is formed, an optical path adjusting layer 60 is formed. The optical path adjusting layer 60 is an element for individually setting a resonant wavelength (display color) of a resonant structure for each display color of the pixels P and is formed of an light-transmissive insulating material such as a silicon compound (typically, silicon nitride or silicon oxide). Specifically, the optical path length (optical distance) between the first power supply conductor 41 and the second electrode E2 included in the resonant structure is appropriately adjusted according to the film thickness of the optical path adjusting layer 60 such that the resonant wavelength of the light emitted from each pixel P is set for each display color.

As exemplified in FIG. 3, on the surface of the optical path adjusting layer 60, the first electrode E1 for each pixel P in the display region 12 and a first conductor 63 in the peripheral region 14 are formed from the same layer. The first electrode E1 and the first conductor 63 are formed of a light-transmissive conductive material such as indium tin oxide (ITO). The first electrode E1 is, as described with reference to FIG. 2, a substantially rectangular electrode (pixel electrode) that functions as the anode of the light-emitting element 45, and as illustrated in FIG. 4, is electrically connected to a relay electrode QE1 via a conduction hole that penetrates through the optical path adjusting layer 60. That is, the first electrode E1 is electrically connected to the active region 10A (drain) of the light emission control transistor TEL via the relay electrodes (QE1, QD1, QB2, and QA4) of the multilayer wiring layer.

The first conductor 63 is formed in an annular shape (rectangular frame shape) that is similar to the second conductor 58. As illustrated in FIG. 11C, the inner peripheral edge of the first conductor 63 is positioned inside the inner peripheral edge (on the peripheral edge side of the substrate 10) of the second conductor 58, and the outer peripheral edge of the first conductor 63 is positioned outside the outer peripheral edge of the second conductor 58. As illustrated in FIGS. 3 and 11C, the first conductor 63 is electrically connected to the second conductor 58 via the conduction hole HF1 that penetrates through the optical path adjusting layer 60. As illustrated in FIG. 13, the conduction hole HF1 is a through-hole formed by removing a rectangular frame-shaped region that surrounds the display region 12 from the optical path adjusting layer 60 in the plan view. The conduction hole HF1 is positioned closer to the display region 12 side than the conduction hole HE1. The first conductor 63 is electrically connected to the second conductor 58 via the conduction hole HF1 over the entire periphery of the peripheral region 14.

As exemplified in FIG. 3, on the surface of the optical path adjusting layer 60 where the first electrode E1 and the first conductor 63 are formed, a pixel defining layer 65 is formed over the entire region of the substrate 10. The pixel defining layer 65 is formed of an inorganic insulating material such as a silicon compound (typically, silicon nitride or silicon oxide). However, other materials may be provided. As understood from FIG. 3, in the pixel defining layer 65, an opening 65A corresponding to each first electrode E1 in the display region 12 is formed.

As exemplified in FIGS. 3 and 4, on the surface of the optical path adjusting layer 60 where the first electrode E1, the first conductor 63, and the pixel defining layer 65 are formed, the light-emitting functional layer 46 is formed. The light-emitting functional layer 46 is configured to include a light-emitting layer formed of an organic EL material and emits white light as current is supplied thereto. The light-emitting layer is formed by a film forming technique known in the art such as a printing technique or a deposition technique. White light is light having a spectrum over the wavelength bands of blue, green, and red in which at least two peaks are observed in the wavelength band of the visible light. In addition, a transporting layer or an injecting layer for electrons or holes supplied to the light-emitting layer may also be included in the light-emitting functional layer 46.

As illustrated in FIG. 3, the light-emitting functional layer 46 is continuous over the plurality of pixels P in the display region 12, and a peripheral edge 48 thereof is positioned in the peripheral region 14 in the plan view. Specifically, the peripheral edge 48 of the light-emitting functional layer 46 is positioned in the second region S2 as illustrated in FIG. 11D. The second region S2 is a rectangular frame-shaped region positioned on the display region 12 side of the first region S1 in the plan view. There may be a manufacturing error in the position of the peripheral edge 48 of the light-emitting functional layer 46. In a case where a film forming technique such as a printing technique that has relatively low manufacturing accuracy is employed to form the light-emitting functional layer 46, the error in the position of the peripheral edge 48 becomes particularly significant. The second region S2 is a region (manufacturing margin) secured to include a margin of error in the position of the peripheral edge 48. Specifically, in one embodiment, it is preferable that the width of the second region S2 be set to a width (for example, 0.6 mm) of about twice that of the first region S1 and be equal to or greater than that of the first region S1 and be equal to or smaller than three times that of the first region S1.

The peripheral edge 48 of the light-emitting functional layer 46 overlaps the second conductor 58 as illustrated in FIGS. 11B to 11D. Specifically, the entire periphery of the peripheral edge 48 overlaps the rectangular frame-shaped second conductor 58 in the plan view. In a configuration in which a portion of the peripheral edge 48 of the light-emitting functional layer 46 overlaps the second conductor 58 and the other portion thereof does not overlap the second conductor 58, there is a possibility that a height difference that reflects the film thickness of the second conductor 58 may be exhibited on the surface of the light-emitting functional layer 46. In this embodiment, since the entire periphery of the peripheral edge 48 overlaps a single member (the second conductor 58), there is an advantage in that the height difference in the surface of the light-emitting functional layer 46 may be reduced.

On the surface of the optical path adjusting layer 60 where the light-emitting functional layer 46 is formed, the second electrode E2 is formed over the entire display region 12. The second electrode E2 is electrically connected to the first conductor 63 via the conduction hole HG1 of the pixel defining layer 65 as illustrated in FIG. 11D. As illustrated in FIG. 13, the conduction hole HG1 is a through-hole formed by removing a rectangular frame-shaped region that surrounds the display region 12 from the pixel defining layer 65 in the plan view, and is positioned in the first region S1 of the peripheral region 14. The second electrode E2 is electrically connected to the first conductor 63 via the conduction hole HG1 over the entire periphery of the peripheral region 14. The conduction hole HG1 is positioned closer to the display region 12 side than the conduction hole HF1.

As understood from FIG. 3 and FIGS. 11A to 11D, the second power supply conductor 42 and the second conductor 58 are connected to each other via the conduction hole HE1, the second conductor 58 and the first conductor 63 are connected to each other via the conduction hole HF1, and the first conductor 63 and the second electrode E2 are connected to each other via the conduction hole HG1. Therefore, the lower power supply potential (second potential) VCT supplied to the second power supply conductor 42 is supplied to second electrode E2 via the second conductor 58 and the first conductor 63. In addition, the conduction holes (HE1, HF1, and HG1) used for connection between the second power supply conductor 42 and the second electrode E2 are formed in the rectangular frame-shaped first region S1 in the plan view. In other words, as illustrated in FIGS. 11A to 11D, a region enclosed by the outer peripheral edge of the conduction hole HE1 and the inner peripheral edge of the conduction hole HG1 is demarcated as the first region S1 in the plan view. In addition, a wiring that is formed in the peripheral region 14 and is connected to the second electrode E2 is referred to as a "peripheral wiring D" in the following description. The peripheral wiring D of the first embodiment includes the second power supply conductor 42, the second conductor 58, and the first conductor 63 as exemplified in FIG. 3.

As exemplified in FIG. 3, a region (light-emitting region) interposed between the first electrode E1 and the second electrode E2 on the inside of each opening 65A of the pixel defining layer 65 in the light-emitting functional layer 46 emits light. That is, on the inside of the opening 65A, a part in which the first electrode E1, the light-emitting functional layer 46, and the second electrode E2 are stacked functions as the light-emitting element 45. As understood from the above description, the pixel defining layer 65 specifies the planar shape or size (a region that actually emits light) of the light-emitting element 45 of each pixel P. The light-emitting device 100 of the first embodiment is a microdisplay in which the light-emitting elements 45 are very finely arranged. For example, in one embodiment, the area of a single light-emitting element 45 (the area of a single opening 65A) is set to be equal to or smaller than 40 $\mu m^2$, and the interval between the light-emitting elements 45 adjacent to each other in the X direction is set to be equal to or smaller than 1.5 $\mu m$. However, different area sizes are contemplated and within the scope of this disclosure.

The second electrode E2 functions as a semi-transmission reflection layer having a property of transmitting a portion of light that reaches the surface and reflecting the remaining portion of the light (semi-transmission reflection properties). For example, the second electrode E2 having the semi-transmission reflection properties is formed by forming a light-reflective conductive material containing, for example silver or magnesium to have a sufficiently low film thickness. The light reflected from the light-emitting functional layer 46 reciprocates between the first power supply conductor 41 and the second electrode E2 so as to allow a component having a specific resonant wavelength to be selectively amplified and is transmitted by the second electrode E2 to be emitted toward an observation side (on the opposite side to the substrate 10). That is, a resonant structure in which light emitted from the light-emitting functional layer 46 resonates is formed between the first power supply conductor 41 functioning as a reflection layer and the second electrode E2 functioning as the semi-transmission reflection layer.

As described above, the conduction hole HG1 for conduction between the second electrode E2 and the first conductor 63 is formed in the first region S1, and the peripheral edge 48 of the light-emitting functional layer 46 is positioned in the second region S2 positioned closer to the display region 12 side than the first region S1. Therefore, as illustrated in FIG. 3 and FIGS. 11A to 11D, the light-emitting functional layer 46 and the conduction hole HG1 do not overlap each other in the plan view.

Figure 14:
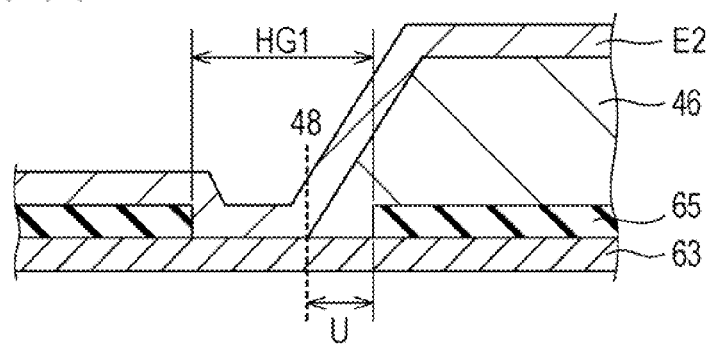
FIG. 14 is a cross-sectional view of the vicinity of the conduction hole formed in the peripheral region in a comparative example.

FIG. 14 is an explanatory view of a configuration in which the conduction hole HG1 and the light-emitting functional layer 46 overlap each other in the plan view (hereinafter, referred to as "Comparative Example 2"). In Comparative Example 2, in a region U in the conduction hole HG1, the light-emitting functional layer 46 is interposed between the second electrode E2 and the first conductor 63. Therefore, in Comparative Example 2, there is a possibility that conduction between the second electrode E2 and the first conductor 63 is insufficient. As described above, there may be a manufacturing error in the position of the peripheral edge 48 of the light-emitting functional layer 46. In a case where the region U is enlarged due to the manufacturing error (in a case where the contact area between the second electrode E2 and the first conductor 63 is reduced), insufficient conduction between the second electrode E2 and the first conductor 63 is particularly exhibited. On the other hand, in the first embodiment, since the light-emitting functional layer 46 and the conduction hole HG1 do not overlap each other, the light-emitting functional layer 46 and the first conductor 63 do not come into contact with each other. Therefore, the light-emitting functional layer 46 and the first conductor 63 are sufficiently connected to each other via the conduction hole HG1.

Figure 15A:
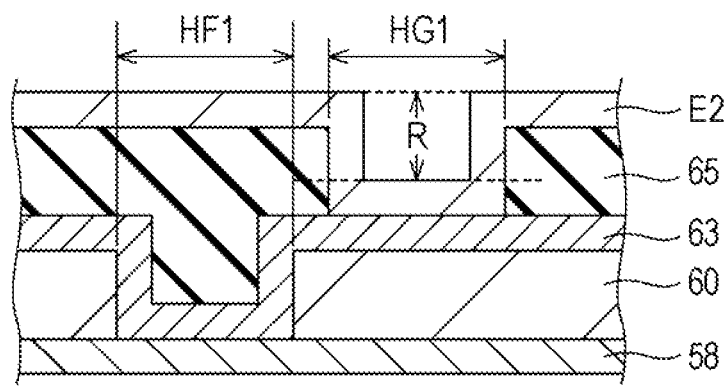
FIGS. 15A and 15B are cross-sectional views of the vicinity of the peripheral edge of a light-emitting functional layer in the first embodiment and in the comparative example.
Figure 15B:
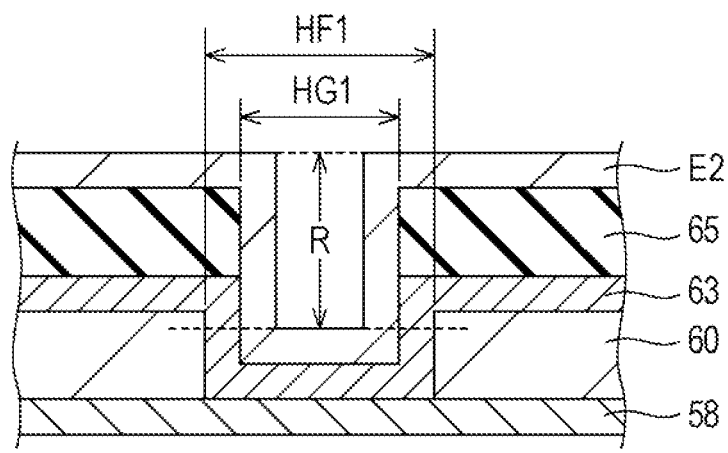

Furthermore, as described above, the conduction hole HG1 is positioned closer to the display region 12 side than the conduction hole HF1 in the plan view, and the conduction hole HF1 is positioned closer to the display region 12 side than the conduction hole HE1. That is, as illustrated in FIGS. 11A to 11D and FIG. 13, the conduction holes HE1, HF1, and HG1 are formed at positions shifted from each other in the plan view. FIG. 15A is an enlarged cross-sectional view of the conduction holes HG1 and HF1 according to this embodiment. FIG. 15B exemplifies a configuration in which the conduction holes HG1 and HF1 overlap each other in the plan view (hereinafter, referred to as "Comparative Example 3"). As illustrated in FIG. 15B, in the case where the conduction holes HG1 and HF1 overlap each other in the plan view, between the surface of a region of the second electrode E2 positioned on the outside of the conduction hole HG1 and the surface of a region thereof which is fitted into the inside of the conduction hole HG1, a height difference R of a height corresponding to the sum of the film thickness of the optical path adjusting layer 60 and the film thickness of the pixel defining layer 65 occurs. Therefore, in each layer that covers the second electrode E2, a height difference (uneven portion) that reflects the height difference R of the surface of the second electrode E2 may occur. On the other hand, in the first embodiment, as illustrated in FIG. 15A, the conduction holes HG1 and HF1 do not overlap each other in the plan view. Therefore, compared to Comparative Example 3, there is an advantage in that the height difference of the surface of the second electrode E2 is reduced. Similarly, in this embodiment, since the conduction holes HE1 and HF1 are formed at positions shifted from each other in the plan view, a height difference corresponding to the sum of the film thickness of the pixel defining layer 65 and the film thickness of the insulating layer LE does not occur. Therefore, the height difference of the surface of the first conductor 63 can be reduced.

When only the conduction between the second electrode E2 and the second power supply conductor 42 is considered, the second power supply conductor 42 only has to be present in the first region S1. However, in the first embodiment, as illustrated in FIG. 11D, the second power supply conductor 42 is formed to cross the second region S2 secured as a manufacturing margin of the light-emitting functional layer 46 in addition to the first region S1. In the above-described configuration, compared to the configuration in which the second power supply conductor 42 is formed only in the first region S1, the area of the second power supply conductor 42 is sufficiently secured. Therefore, there is an advantage in that the resistance of the second power supply conductor 42 is reduced. Due to a reduction in the resistance, a voltage drop in the second power supply conductor 42 is suppressed, and thus the potential VCT supplied to each pixel P in the display region 12 is uniformized. Therefore, there is an advantage in that display spots caused by an error in the potential VCT are reduced.

As exemplified in FIG. 3, on the surface of the second electrode E2, a sealing body 70 is formed over the entire region of the substrate 10. Illustration of the sealing body 70 is omitted from FIG. 4 for convenience. The sealing body 70 is a light-transmissive film body which prevents infiltration of outside air or moisture by sealing each element formed on the substrate 10 and is configured by stacking a first sealing layer 71, a second sealing layer 72, and a third sealing layer 73. The first sealing layer 71 is formed on the surface of the third sealing layer 73, and the second sealing layer 72 is formed on the surfaces of the first and third sealing layers 71 and 73.

The third sealing layer 73 of the sealing body 70 is formed on the surface of the second electrode E2 to directly come into contact with the surface of the second electrode E2. As understood from FIG. 3, the third sealing layer 73 is formed over the entire region of the substrate 10 including the display region 12 and the peripheral region 14. The third sealing layer 73 is formed of an inorganic insulating material such as a silicon compound (typically, silicon nitride or silicon oxide, among other materials) to have a film thickness of, for example, about 200 nm to about 400 nm. However, different film thickness may be provided below 200 nm and above 400 nm. The third sealing layer 73 is formed to be appropriate for a film thickness that is equal to or greater than a film thickness difference (for example, 120 nm) of the optical path adjusting layer 60. To form the third sealing layer 73, a high-density plasma film forming technique such as a plasma chemical vapor deposition (CVD) method, an electron cyclotron resonance (ECR) plasma sputtering method, or an ion plating method, among others, are appropriately used. The third sealing layer 73 may be formed of silicon oxynitride by depositing silicon oxide in a nitrogen atmosphere. Otherwise, an inorganic oxide represented by a metal oxide such as titanium oxide may also be employed as the material of the third sealing layer 73.

The first sealing layer 71 is an element that seals the light-emitting element 45 and as illustrated in FIG. 3, is configured to include a sealing surface 82 and a side end surface 84. The sealing surface 82 is a surface that overlaps the light-emitting element 45 in the upper surface of the first sealing layer 71 (a surface on the opposite side to the surface that comes into contact with the third sealing layer 73). The side end surface 84 is a surface connected to the sealing surface 82 and is inclined with respect to the sealing surface 82 while being positioned on the outside of the sealing surface 82 in the plan view. The side end surface 84 includes an upper peripheral edge 86 on the sealing surface 82 side and a lower peripheral edge 88 on the substrate 10 side, and is formed to have a film thickness that decreases toward the lower peripheral edge 88. The lower peripheral edge 88 of the first sealing layer 71 is positioned in the third region S3 on the peripheral edge side of the substrate 10 of the first region S1 (on the opposite side to the display region 12) in the plan view as illustrated in FIG. 11D. The third region S3 is a rectangular frame-shaped region having a predetermined width. There may be a manufacturing error in the position of the lower peripheral edge 88 of the first sealing layer 71. In a case where a film forming technique such as a printing technique that has relatively low manufacturing accuracy is employed to form the first sealing layer 71, the error in the position of the lower peripheral edge 88 becomes particularly significant. The third region S3 is a region (manufacturing margin) secured to include a margin of error in the position of the lower peripheral edge 88. Specifically, in one embodiment, it is preferable that the width of the third region 33 be set to a width (for example, 0.6 mm) of about twice that of the first region S1 and be equal to or greater than that of the first region S1 and be equal to or smaller than three times that of the first region S1.

As illustrated in FIGS. 11B to 11D, the lower peripheral edge 88 overlaps the second conductor 58. Specifically, similarly to the peripheral edge 48 of the light-emitting functional layer 46, the lower peripheral edge 88 overlaps the second conductor 58 of which the entire periphery has a rectangular frame shape in the plan view. Therefore, as described above regarding the light-emitting functional layer 46, compared to a configuration in which a portion of the lower peripheral edge 88 overlaps the second conductor 58 and the other portion thereof does not overlap the second conductor 58, it is possible to reduce a height difference in the surface of the first sealing layer 71 (the lower peripheral edge 88).

As described above, when only the conduction between the second electrode E2 and the second power supply conductor 42 is considered, the second power supply conductor 42 only has to be present in the first region S1. However, in the first embodiment, as illustrated in FIG. 11D, the second power supply conductor 42 is formed to also cross the third region S3 secured as a manufacturing margin of the first sealing layer 71 in addition to the first region S1. In the above-described configuration, compared to the configuration in which the second power supply conductor 42 is formed only in the first region S1, the area of the second power supply conductor 42 is sufficiently secured. Therefore, there is an advantage in that the resistance of the second power supply conductor 42 is reduced. Due to a reduction in the resistance, a voltage drop in the second power supply conductor 42 is suppressed, and thus the potential VCT supplied to each pixel P in the display region 12 is uniformized. Therefore, there is an advantage in that display spots caused by an error in the potential VCT are reduced.

The first sealing layer 71 functions as a planarization film which buries the height difference of the surface of the second electrode E2 or the third sealing layer 73. That is, a height difference that reflects the shape of each element of the lower side (the substrate 10 side) is formed on the surface of the second electrode E2 or the third sealing layer 73. However, the sealing surface 82 of the first sealing layer 71 is a substantially flat surface in which a height difference is sufficiently reduced. In other words, the sealing surface 82 of the first sealing layer 71 is flat compared to the lower surface thereof (that is, the surface that comes into contact with the third sealing layer 73). For example, the first sealing layer 71 covers the conduction holes (HE1, HF1, and HG1) formed in the first region S1, and planarizes height differences formed in the surface of the first region S1 (the second electrode E2 or the third sealing layer 73) due to the conduction holes. In order to realize the planarization function described above, the first sealing layer 71 in one embodiment is formed to have a sufficiently thick film thickness (for example, 1 μm to 5 μm, particularly appropriately, 3 μm) compared to the second and third sealing layers 72 and 73. The first sealing layer 71 is formed by applying a solution of a light-transmissive organic material such as an epoxy resin onto the surface of the second sealing layer 72 using an application technique known in the art (for example, a printing method or a spin coating method) and curing the result by a heating treatment. The material of the first sealing layer 71 is not limited to the organic material. For example, the first sealing layer 71 having a film thickness large enough to perform planarization may also be formed by applying an inorganic material such as silicon oxide using an application technique such as a printing method and drying the result. The first sealing layer 71 is continuous over a large region compared to a region where the light-emitting functional layer 46 is formed and is formed to cover at least the light-emitting functional layer 46. In addition, a configuration in which the first sealing layer 71 covers the second electrode E2 may also be employed.

As understood from FIG. 3, the second sealing layer 72 is formed over the entire region of the substrate 10 including the display region 12 and the peripheral region 14. The second sealing layer 72 in one embodiment is formed of, for example, an inorganic material having excellent water resistance or heat resistance to have a film thickness of, for example, about 300 nm to 700 nm (particularly appropriately about 400 nm). For example, a nitrogen compound (e.g., silicon nitride, silicon oxide, or silicon oxynitride) may be used for the material of the third sealing layer 73. In order to form the second sealing layer 72, film forming techniques in the art exemplified to form the third sealing layer 73 may be employed. One particular configuration of the sealing body 70 has been described above.

Figure 16:
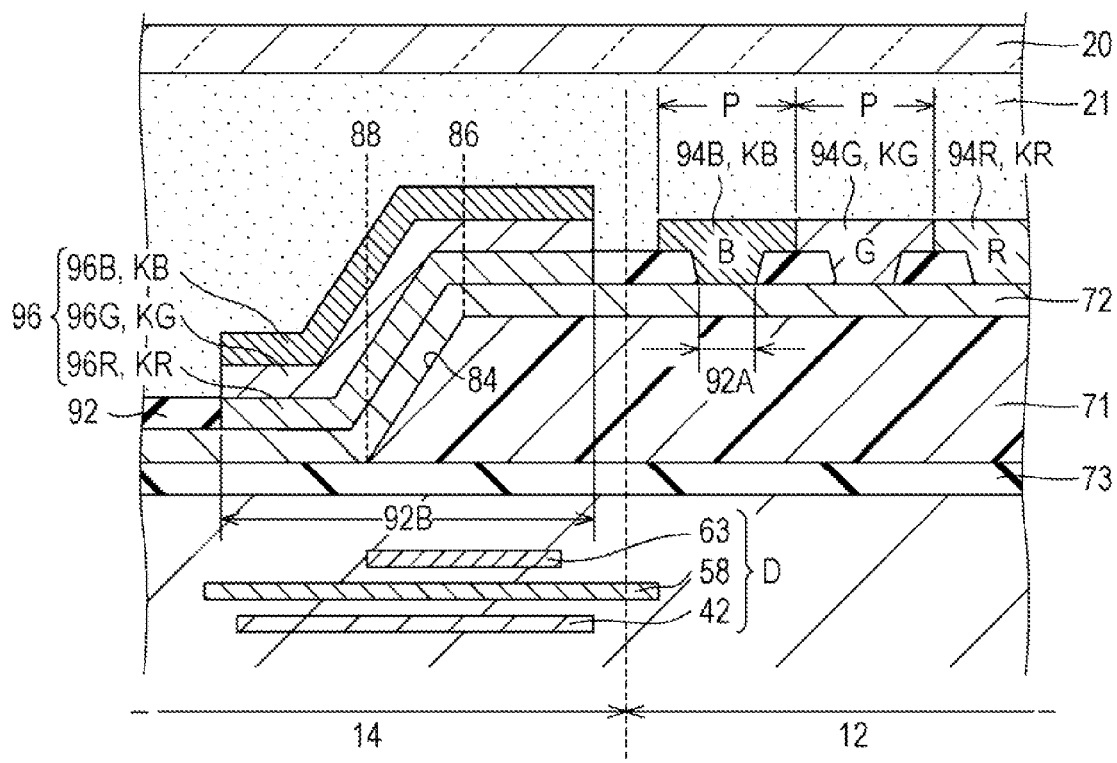
FIG. 16 is a cross-sectional view of a sealing body and a filter layer.
Figure 17:
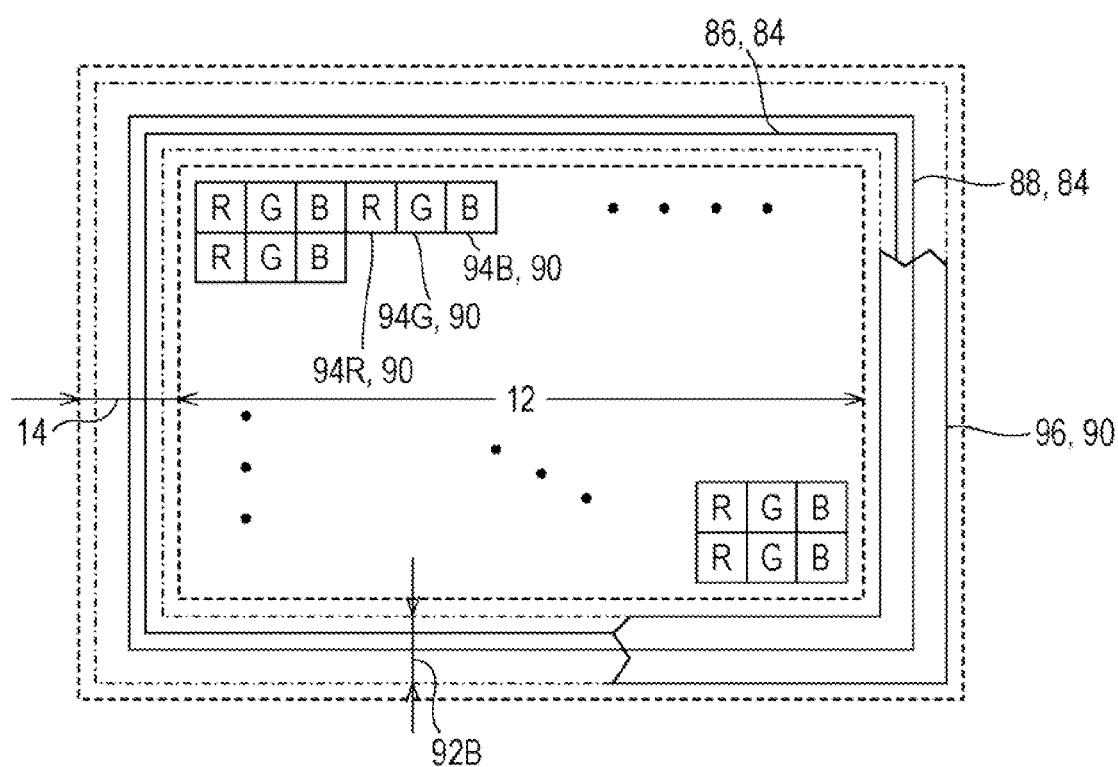
FIG. 17 is a plan view of the sealing body and the filter layer.

A filter layer 90 is formed on the surface of the sealing body 70 (the second sealing layer 72). Here, in FIG. 16, the filter layer 90 is stacked on the surface of the sealing body 70 (the second sealing layer 72). FIG. 16 is a cross-sectional view of the sealing body 70 and the filter layer 90 (an insulating layer 92, color filters 94, and a protection portion 96), and FIG. 17 is a plan view. In FIG. 17, a portion of the filter layer 90 (the protection portion 96) is illustrated by a solid line, and the external form of the other portion thereof is expressed by a dashed line. In FIGS. 3 and 4, illustration of the filter layer 90 is omitted for convenience.

The filter layer 90 includes the insulating layer 92, a plurality of color filters 94, and the protection portion 96. The insulating layer 92 is an insulating member formed on the surface of the second sealing layer 72 and is formed over the entire region of the substrate 10. As illustrated in FIG. 16, an opening (first opening) 92A is formed in the insulating layer 92 of the display region 12 for each pixel P, and an opening (second opening) 92B is formed in the insulating layer 92 of the peripheral region 14. The opening 92B is formed in a rectangular frame-shaped region that surrounds the display region 12 in the plan view as illustrated in FIG. 17.

The color filters 94 and the protection portion 96 are formed from colored layers K (KR, KG, and KB) which transmit light having predetermined wavelengths. Specifically, the color filters 94 and the protection portion 96 of the first embodiment is configured to include a plurality of colored layers K (KR, KG, and KB) that transmit light having different wavelengths. The first colored layer KR transmits red light having a wavelength of about 610 nm, the second colored layer KG transmits green light having a wavelength of about 550 nm, and the third colored layer KB transmits blue light having a wavelength of about 470 nm. However, as should be appreciated, the colored layers may be configured to transmit different wavelengths of light.

The filter layer 90 of the first embodiment includes the plurality of color filters 94 (94R, 94G, and 94B) which transmit single color lights having different wavelengths. The first color filter 94R is formed from the first colored layer KR. Similarly, the second color filter 94G is formed from the second colored layer KG, and the third color filter 94B is formed from the third colored layer KB. Each color filter 94 is disposed on the inside of the opening 92A formed in the insulating layer 92 for each pixel P and overlaps the light-emitting element 45 of the corresponding pixel P in the plan view. Specifically, the first color filter 94R overlaps the light-emitting element 45 of the pixel P for red color (the pixel P of which the resonant wavelength is set to the wavelength of red light), the second color filter 94G overlaps the light-emitting element 45 of the pixel P for green color, and the third color filter 94B overlaps the light-emitting element 45 of the pixel P for blue color. As understood from FIG. 16, the insulating layer 92 functions as a barrier of each color filter 94. Light emitted from each light-emitting element 45 is colored by the color filter 94 that overlaps the corresponding light-emitting element 45 and thereafter is emitted to the outside of the light-emitting device 100 so as to be visually recognizable by an observer. In addition, in FIG. 17, a stripe arrangement in which a plurality of pixels P for the same color are arranged in the Y direction is exemplified. However, the arrangement of the pixels P for each display color is arbitrary in this embodiment.

The protection portion 96 is an element for enhancing the sealing performance of the sealing body 70. As illustrated in FIGS. 16 and 17, the protection portion 96 is formed in a rectangular frame shape in the peripheral region 14 so as to surround the display region 12 over the entire periphery in the plan view. Therefore, the display region 12 is positioned on the inside of the protection portion 96, and the mounting region 16 is positioned on the outside of the protection portion 96. That is, the protection portion 96 is present between the display region 12 and the mounting region 16.

The protection portion 96 overlaps the lower peripheral edge 88 positioned closer to the substrate 10 side in the side end surface 84 of the first sealing layer 71 in the plan view. In a configuration in which the surface of the sealing body 70 is exposed from the inside of the peripheral region 14, there is a possibility that moisture or outside air may infiltrate into the boundary portion (the lower peripheral edge 88) between the first sealing layer 71 and the base surface (the third sealing layer 73) of the first sealing layer 71 and may reach the light-emitting element 45. In this embodiment, since the protection portion 96 overlaps the lower peripheral edge 88 of the first sealing layer 71, infiltration of moisture or outside air from the peripheral edge of the first sealing layer 71 is prevented. That is, it is possible to enhance the sealing performance of the first sealing layer 71.

As understood from FIG. 16, there is a problem in that a part (hereinafter, referred to as an "angular portion") of the second sealing layer 72 which overlaps the upper peripheral edge 86 is easily influenced by external force compared to the flat part of the second sealing layer 72 positioned on the surface of the sealing surface 82 and thus is easily damaged. The protection portion 96 (a first layer 96R) of this embodiment overlaps the upper peripheral edge 86 of the first sealing layer 71 on the surface of the second sealing layer 72 (that is, covers the angular portion of the second sealing layer 72). That is, the angular portion of the second sealing layer 72 which is easily damaged is protected by the protection portion 96. Therefore, there is an advantage in that the possibility of the angular portion of the second sealing layer 72 being damaged is reduced (infiltration of outside air or moisture from the broken part of the second sealing layer 72 is prevented).

As illustrated in FIG. 16, the protection portion 96 of the first embodiment is configured by stacking the first layer 96R, a second layer 96G, and a third layer 96B. The first layer 96R is formed on the second sealing layer 72. The second layer 96G is formed to overlap the first layer 96R, and the third layer 96B is formed to overlap the second layer 96G. The first layer 96R is formed from the first colored layer KR. Similarly, the second layer 96G is formed from the second colored layer KG, and the third layer 96B is formed from the third colored layer KB.

As described above, the first color filter 94R and the first layer 96R of the protection portion 96 are formed from the same layer (the first colored layer KR). Similarly, the second color filter 94G and the second layer 96G are formed from the same layer (the second colored layer KG), and the third color filter 94R and the third layer 96B are formed from the same layer (the third colored layer KB). According to the above-described configuration, the protection portion 96 can be formed in a process of forming the color filter 94 for each color. That is, a process of forming the protection portion 96 does not need to be performed separately from the formation of the color filters 94. Therefore, compared to a configuration in which the protection portion 96 and the color filters 94 are formed separately from each other, there is an advantage in that the manufacturing process of the light-emitting device is simplified.

As illustrated in FIG. 16, the protection portion 96 overlaps the peripheral wiring D (the second power supply conductor 42, the second conductor 58, and the first conductor 63) in the peripheral region 14 in the plan view. FIG. 16 exemplifies a configuration in which a portion of the peripheral wiring D (the entire portions of the second power supply conductor 42 and the first conductor 63 and a portion of the second conductor 58) overlaps the protection portion 96. When external light enters the peripheral region 14, there is a possibility that the external light may be reflected by the peripheral wiring D and may be sensed by the observer. In the first embodiment, since the peripheral wiring D and the protection portion 96 overlap each other in the plan view, light that is directed to the peripheral wiring D from the observation side or the light reflected by the surface of the peripheral wiring D are shielded by the protection portion 96. Therefore, there is an advantage in that the light reflected by the surface of the peripheral wiring D (reflection of an object on the observation side) is less likely to be sensed by the observer. In the first embodiment, particularly, the protection portion 96 is formed by stacking the first layer 96R for red color, the second layer 96G for green color, and the third layer 96B for blue color. Therefore, for example, compared to a configuration in which the protection portion 96 is formed of a single layer or two layers, it is possible to impart sufficient light-shielding performance to the protection portion 96. However, the protection portion 96 may also be configured to include a single layer or two layers.

Figure 18:
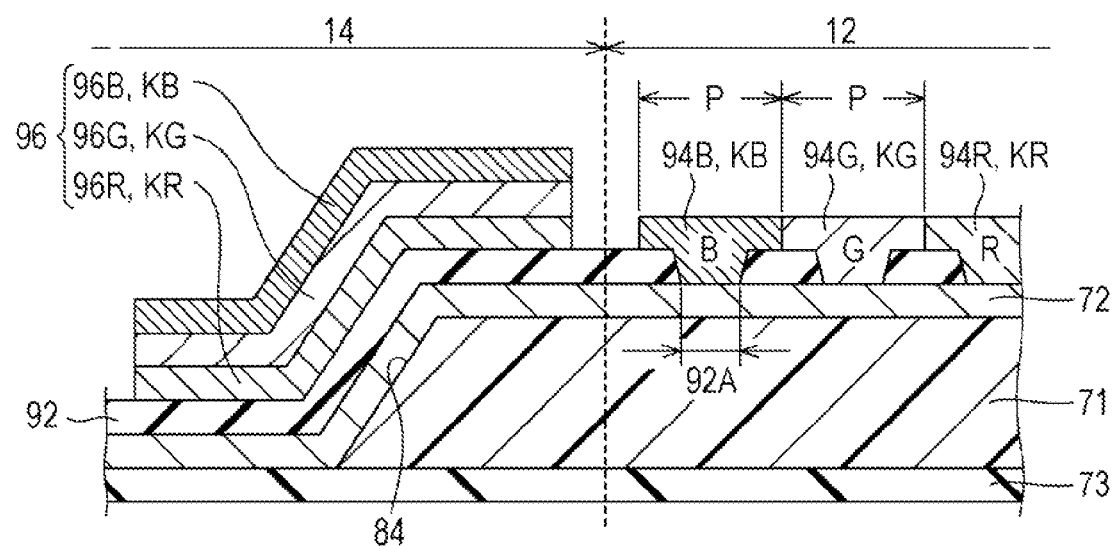
FIG. 18 is a cross-sectional view of the sealing body and the filter layer in the comparative example.

As exemplified in FIG. 16, a sealing substrate 20 is joined to the surface of the filter layer 90 via an adhesive layer 21. The sealing substrate 20 is, for example, a light-transmissive plate-like member formed of glass, quartz, or the like. The adhesive layer 21 is formed by curing an adhesive applied onto the surface of the filter layer 90. To apply the adhesive, a spin coating method or the like is appropriately employed. Specifically, the adhesive before curing is dropped onto the substrate 10 (the filter layer 90), and the substrate 10 is rotated to allow the adhesive to flow such that the adhesive is uniformly applied to the entire region of the surface of the filter layer 90 (the surfaces of the insulating layer 92, the third layer 96B, and each color filter 94). When a height difference is formed in the surface of the filter layer 90, the flow of the adhesive on the surface of the filter layer 90 is impeded by the height difference and the adhesive is not uniformly applied, resulting in failure in the film formation of the adhesive layer 21. Particularly, as the height difference formed in the surface of the filter layer 90 increases, the likelihood of failure in film formation increases. FIG. 18 is an explanatory view of a configuration in which the opening 92B is not formed in the insulating layer 92 and the protection portion 96 is formed on the surface of the insulating layer 92 (hereinafter, referred to as "Comparative Example 4"). In Comparative Example 4, since the protection portion 96 is formed on the surface of the insulating layer 92, a height difference corresponding to the film thickness of the protection portion 96 (the sum of the film thicknesses of the first, second, and third layers 96R, 96G, and 96B) occurs in the surface of the filter layer 90. On the other hand, in this embodiment, as illustrated in FIG. 16, the protection portion 96 is formed on the inside of the opening 92R formed in the insulating layer 92 (on the surface of the second sealing layer 72 which is lower than the insulating layer 92). Therefore, in this embodiment, the height difference that occurs in the surface of the filter layer 90 has a size measurement obtained by subtracting the film thickness of the insulating layer 92 from the film thickness of the protection portion 96. That is, compared to Comparative Example 4, the height difference formed in the surface of the filter layer 90 is reduced, resulting in a reduction in failure in the film formation of the adhesive layer 21.

Second Embodiment

A second embodiment will now be described. In the embodiments exemplified as follows, like elements having the same actions or functions as those of the first embodiment are denoted by like reference numerals referred to in the description of the first embodiment, and detailed description thereof will be appropriately omitted.

Figure 19:
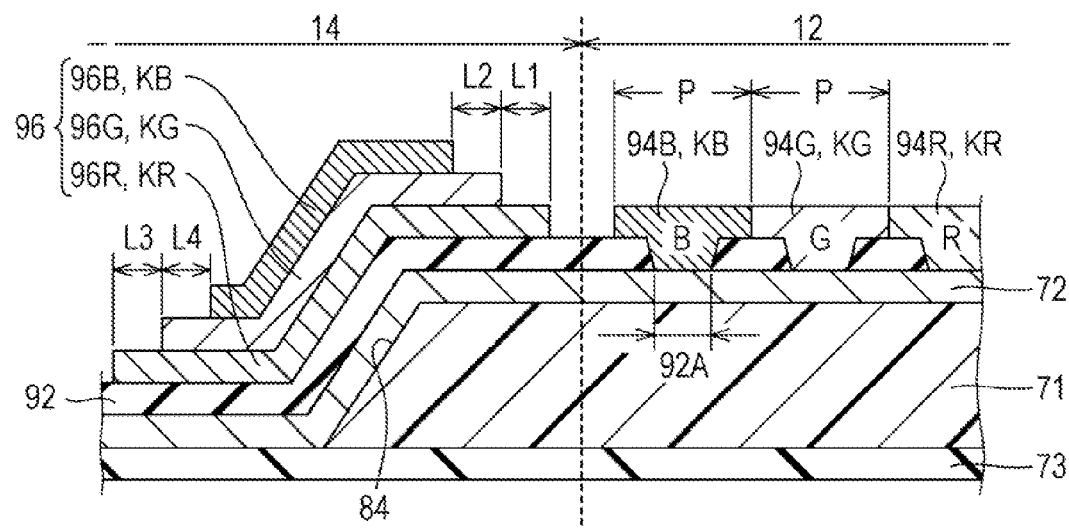
FIG. 19 is a cross-sectional view of the sealing body and the filter layer in a second embodiment.

FIG. 19 is an explanatory view of the filter layer 90 formed on the surface of the sealing body 70 of the second embodiment. As exemplified in FIG. 19, in the insulating layer 92 of the second embodiment, the opening 92B described in the first embodiment is not formed. The protection portion 96 of the second embodiment is different from that of the first embodiment in the positional relationship between the peripheral edges of the layers (the first, second, and third layers 96R, 96G, and 96B). In the first embodiment, the peripheral edges of the layers of the protection portion 96 overlap each other in the plan view (the side surfaces of the layers are aligned with each other). In contrast, in the second embodiment, the positions of the peripheral edges of the layers in the plan view are different from each other.

Specifically, as illustrated in FIG. 19, the inner peripheral edge of the first layer 96R is positioned closer to the display region 12 side than the inner peripheral edge of the second layer 96G by a distance L1, and the outer peripheral edge of the first layer 96R is positioned closer to the peripheral edge side of the substrate 10 (the opposite side to the display region 12) than the outer peripheral edge of the second layer 96G by a distance L3. That is, the second layer 96G is formed to have a smaller area than the first layer 96R so as to be included in a range in which the first layer 96R is formed immediately therebelow in the plan view. Similarly, the inner peripheral edge of the second layer 96G is positioned closer to the display region 12 side than the inner peripheral edge of the third layer 96B by a distance L2, and the outer peripheral edge of the second layer 96G is positioned closer to the peripheral edge side of the substrate 10 than the outer peripheral edge of the third layer 96B by a distance L4. Therefore, the side surface on the inner peripheral edge side of the protection portion 96 and the side surface on the outer peripheral edge side thereof are formed in a stepped shape with height differences corresponding to the film thicknesses of the layers. A distance from the distance L1 to the distance L4 is set to have an appropriate size and appropriately has a size greater than the film thickness of the first to third layers 96R to 96B. For example, when the first to third layers 96R to 96B have a film thickness of about 1 µm, the distance from the distance L1 to the distance L4 may be about 5 µm. However, as should be appreciated, other distances are contemplated by this disclosure.

Even in the second embodiment, the same effects as those of the first embodiment are realized. In addition, for example, in the configuration in which the protection portion 96 in which the side surfaces of the first to third layers 96R to 96B are aligned with each other is formed on the surface of the insulating layer 92 (for example, Comparative Example 4 illustrated in FIG. 18), a height difference corresponding to the sum of the film thicknesses of the layers of the protection portion 96 (the first, second, and third layers 96R, 96G, and 96B) is formed on the surface of the filter layer 90. In the second embodiment, as understood from FIG. 19, a height difference of a single step on the surface of the filter layer 90 corresponds to the film thickness of each of the layers (96R, 96G, and 96B) constituting the protection portion 96 and is smaller than the sum of the film thicknesses of the layers of the protection portion 96. As described above, according to the second embodiment, each height difference (height difference that may impede the flow of the dropped adhesive) formed in the surface of the filter layer 90 (the surfaces of the insulating layer 92, the first layer 96R, the second layer 96G, the third layer 96B, and each color filter 94) by forming the protection portion 96 is smaller than that in Comparative Example 4. Therefore, according to this embodiment, in a case where the adhesive is applied onto the surface of the filter layer 90 using a spin coating method or the like, a possibility that the flow of the adhesive is impeded by the height difference of the filter layer 90 is reduced. As a result, the failure in the film formation of the adhesive layer 21 is reduced.

Modification Example

The embodiments discussed above may be modified in various forms. Specific modifications are described below. Two or more forms that are arbitrarily selected from the following examples may be appropriately combined.

Figure 20:
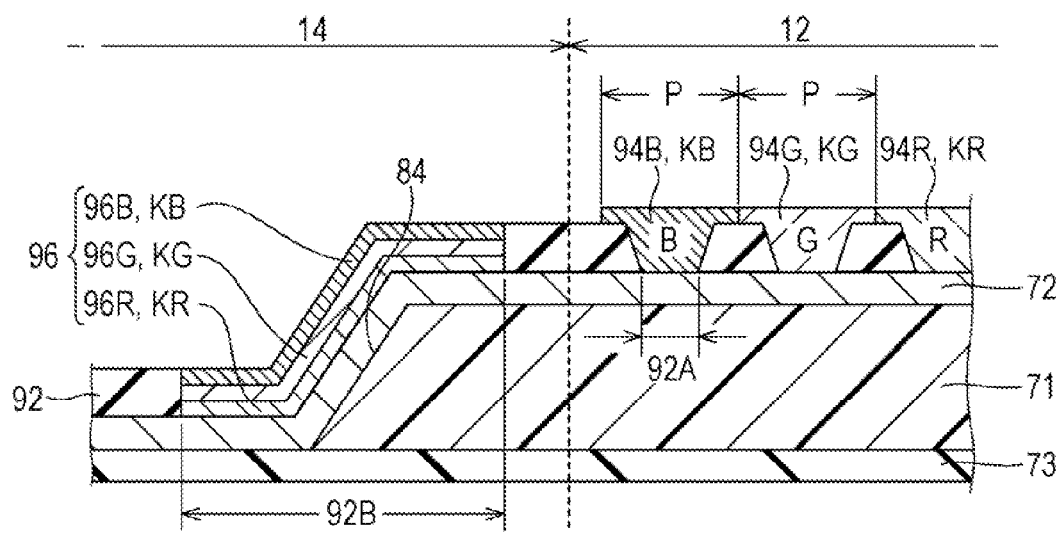
FIG. 20 is a cross-sectional view of the sealing body and the filter layer in another embodiment.

(1) From the viewpoint of reducing the height difference in the surface of the filter layer 90, as illustrated in FIG. 20, the protection portion 96 having the same film thickness as that of the insulating layer 92 may be formed on the inside of the opening 92B formed in the insulating layer 92. According to the above configuration, as illustrated in FIG. 20, since the surface of the insulating layer 92 and the surface of the protection portion 96 are positioned on substantially the same plane, an effect of a reduction in the height difference in the surface of the filter layer 90 becomes more significant.

However, in the case where the spin coating method or the like is employed to form the adhesive layer 21, there is a possibility that the adhesive that is dropped into the display region 12 may flow to and reach the mounting region 16 from the display region 12 or the peripheral region 14. In the case where the adhesive reaches the mounting region 16 and adheres to the surface of each mounting terminal 36, there is a possibility that the mounting terminal 36 and the terminal of the external circuit may not be sufficiently electrically connected. In the first embodiment, the protection portion 96 is positioned between the display region 12 and the mounting region 16 and thus the height difference corresponding to the film thickness of the protection portion 96 is exhibited from the surface of the filter layer 90. In the above-described configuration, since the flow of the adhesive toward the mounting region 16 is impeded by the height difference of the protection portion 96, there is an advantage in that failure in conduction between the mounting terminal 36 and the terminal of the external circuit caused by the adhesion of the adhesive is prevented.

(2) In each of the above-described embodiments, although the configuration in which the protection portion 96 covers the side end surface 84 of the first sealing layer 71 is exemplified, the positional relationship between the first sealing layer 71 and the protection portion 96 is not limited to the above-described example. For example, a configuration in which the protection portion 96 is formed in a region of the substrate 10 on the peripheral edge side (on the opposite side to the display region 12 side) as viewed from the peripheral edge (the lower peripheral edge 88) of the first sealing layer 71 (that is, a configuration in which the protection portion 96 does not overlap the first sealing layer 71 in the plan view) may also be employed. In addition, a configuration in which the protection portion 96 is formed on the sealing surface 82 of the first sealing layer 71 (a configuration in which the protection portion 96 is positioned in a region on the display region 12 side as viewed from the upper peripheral edge 86 of the first sealing layer 71) may also be employed. As understood from the above description, whether or not the protection portion 96 overlaps the first sealing layer 71 (the side end surface 84 of the first sealing layer 71) in the plan view should be appreciated as within this disclosure.

(3) Each element in each of the above-described embodiments may also be appropriately omitted. For example, in each of the above-described embodiments, the filter layer 90 is configured to include the insulating layer 92. However, the insulating layer 92 may also be omitted from the filter layer 90. In addition, although the sealing body 70 is configured to include the first, second, and third sealing layers 71, 72, and 73, each layer may also be appropriately omitted. For example, in a case where the second sealing layer 72 is omitted, the protection portion 96 is directly formed on the surface of the first sealing layer 71. In addition, although the protection portion 96 is configured to include the first, second, and third layers 96R, 96G, and 96B, for example, the protection portion 96 may also be configured to include any one or two layers of the first to third layers 96R to 96B.

(4) In each of the above-described embodiments, the protection portion 96 which overlaps both the side end surface 84 of the first sealing layer 71 and the peripheral wiring D is exemplified. However, a configuration in which the protection portion 96 overlaps any one of the side end surface 84 and the peripheral wiring D may also be employed.

(5) In each of the above-described embodiments, the protection portion 96 is formed to overlap the peripheral edge of the first sealing layer 71. However, the protection portion 96 may also be formed to overlap the peripheral edge 48 of the light-emitting functional layer 46. In the above-described configuration, as in the first embodiment, infiltration of moisture or outside air into the gap between the peripheral edge 48 and the base layer is reduced.

(6) In each of the above-described embodiments, the protection portion 96 is formed to overlap the entire periphery of the lower peripheral edge 88. However, the protection portion 96 may also overlap a portion of the lower peripheral edge 88. Similarly, the protection portion 96 may also overlap a portion of the upper peripheral edge 86. In addition, in each of the above-described embodiments, the configuration in which the protection portion 96 overlaps a portion of the peripheral wiring D is employed. However, a configuration in which the protection portion 96 overlaps the entire region of the peripheral wiring D in the plan view may also be employed.

(7) In each of the above-described embodiments, the protection portion 96 overlaps both the upper peripheral edge 86 and the lower peripheral, edge 88 of the first sealing layer 71. However, the protection portion 96 may also overlap any one of the upper peripheral edge 86 and the lower peripheral edge 88.

(8) The type of the colored layer K of the filter layer 90 is not limited to the examples of each of the above-described embodiments. For example, the filter layer 90 may be configured to include, in addition to the first colored layer KR that transmits red light, the second colored layer KG that transmits green light, and the third colored layer KB that transmits blue light, a fourth colored layer that transmits yellow light having a wavelength of about 580 nm. In the above-described configuration, the pixel P of which the display color is yellow is formed in the display region 12, and a fourth color filter that overlaps the light-emitting element 45 of the pixel P and a fourth layer that overlaps the third layer 96B of the protection portion 96 are formed from the same layer using the fourth colored layer.

(9) Although the light-emitting element 45 which uses the organic EL material is exemplified in each of the above-described embodiments, various embodiments are similarly applied to a configuration in which a light-emitting element having a light-emitting layer formed of an inorganic EL material or a light-emitting element such as an LED is used. In addition, in each of the above-described embodiments, a top emission-type light-emitting device 100 in which light is emitted toward the opposite side to the substrate 10 is exemplified. However, various embodiments are similarly applied to a bottom emission-type light-emitting device in which light is emitted toward the substrate 10 side.

Electronic Apparatus

Figure 21:
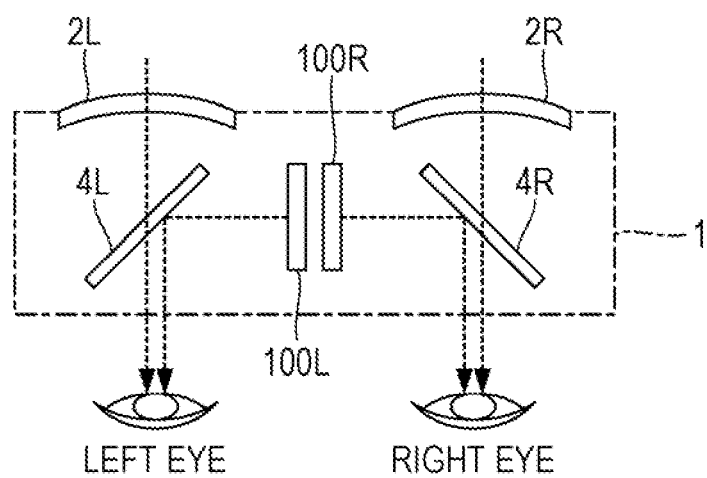
FIG. 21 is a schematic view of a head mounted display device illustrating an electronic apparatus in which one or more embodiments may be implemented.

The light-emitting device 100 exemplified in each of the above-described embodiments may be appropriately used as a display device in various types of electronic apparatuses. FIG. 21 exemplifies a head mounted display device 1

(HMD) which uses the light-emitting device 100 exemplified in one or more of the above-described embodiments, as an electronic apparatus.

The display device 1 is an electronic apparatus which can be mounted on the head of a user and includes a transmitting portion (lens) 2L which overlaps the left eye of the user, a transmitting portion 2R which overlaps the right eye of the user, a light-emitting device 100L and a half mirror 4L for the left eye, and a light-emitting device 100R and a half mirror 4R for the right eye. The light-emitting devices 100L and 100R are arranged so that lights emitted therefrom travel in opposite directions to each other. The half mirror 4L for the left eye transmits the light transmitted by the transmitting portion 2L toward the left eye of the user and reflects the light emitted from the light-emitting device 100L toward the left eye of the user. Similarly, the half mirror 4R for the right eye transmits the light transmitted by the transmitting portion 2R toward the right eye of the user and reflects the light emitted from the light-emitting device 100R toward the right eye of the user. Therefore, the user senses images in which images observed via the transmitting portions 2L and 2R and display images from each of the light-emitting devices 100 overlap. In addition, stereoscopic images (images for the left eye and image for the right eye) to which parallax is mutually applied are displayed on the light-emitting device 100L and the light-emitting device 100R such that stereoscopic effects of the display images can be sensed by the user.

In addition, the electronic apparatus to which the light-emitting device 100 of each of the above-described embodiments is applied is not limited to the display device 1 of FIG. 21. For example, the light-emitting device 100 may be appropriately used in an electronic view finder (EVF) used for an imaging device such as a video camera or a still camera. In addition, the light-emitting device 100 can also be employed by various types of electronic apparatuses such as mobile phones, portable information terminals (smartphones), monitors of televisions, personal computers, and the like, car navigation devices, and the like.

What is claimed is:

1. A light-emitting device comprising:
    a light-emitting element disposed in a display region, the light-emitting element including a first electrode, a second electrode, and a light-emitting functional layer that emits light according to current, the light-emitting functional layer being disposed between the first electrode and the second electrode;
    a peripheral wiring formed in a periphery of the display region in a plan view and electrically connected to the second electrode; and
    a filter layer having a first color filter that overlaps the light-emitting element and a first layer that overlaps the peripheral wiring,
    wherein the first color filter and the first layer are formed from a first colored layer that transmits light having a first wavelength.
2. The light-emitting device according to claim 1,
    wherein the filter layer includes a second color filter that overlaps the light-emitting element and a second layer formed on a surface of the first layer and that overlaps the peripheral wiring,
    wherein the second color filter and the second layer are formed from a second colored layer that transmits light having a second wavelength that is different from the first wavelength.
3. The light-emitting device according to claim 2,
    wherein a peripheral edge of the second layer is positioned on an inside of a peripheral edge of the first layer in the plan view.
4. The light-emitting device according to claim 2,
    wherein the filter layer includes a third color filter that overlaps the light-emitting element and a third layer formed on a surface of the second layer and that overlaps the peripheral wiring,
    wherein the third color filter and the third layer are formed from a third colored layer that transmits light having a third wavelength that is different from the first and second wavelengths.
5. The light-emitting device according to claim 4,
    wherein a peripheral edge of the third layer is positioned on an inside of a peripheral edge of the second layer in the plan view.
6. The light-emitting device according to claim 4,
    wherein the filter layer includes an insulating layer in which a plurality of first openings are formed in the display region and a second opening that overlaps the peripheral wiring is formed,
    the first, second, and third color filters are formed on an inside of the plurality of first openings, and
    the first, second, and third layers are formed on an inside of the second opening.
7. A light-emitting device comprising:
    a light-emitting element disposed on a surface of a base body;
    a first sealing layer that includes a sealing surface that overlaps the light-emitting element and a side end surface that is positioned on an outside of the sealing surface in a plan view and is inclined with respect to the sealing surface, and seals the light-emitting element; and
    a filter layer having a first color filter that overlaps the light-emitting element and a first layer that overlaps a peripheral edge of the side end surface on the base body side,
    wherein the first color filter and the first layer are formed from a first colored layer that transmits light having a first wavelength.
8. The light-emitting device according to claim 7, further comprising:
    a second sealing layer that covers the first sealing layer,
    wherein the first layer is formed on a surface of the second sealing layer and overlaps a peripheral edge of the side end surface on the sealing surface side.
9. The light-emitting device according to claim 7,
    wherein the light-emitting element is disposed in a display region and includes a first electrode, a second electrode, and a light-emitting functional layer that emits light according to current between the first electrode and the second electrode,
    a peripheral wiring that is formed in a periphery of the display region in a plan view is electrically connected to the second electrode, and
    the first layer overlaps the peripheral wiring.
10. The light-emitting device according to claim 7,
    wherein the filter layer includes a second color filter that overlaps the light-emitting element and a second layer that overlaps the first layer,
    wherein the second color filter and the second layer are formed from a second colored layer that transmits light having a second wavelength that is different from the first wavelength.

11. The light-emitting device according to claim 10,
wherein the filter layer includes a third color filter that overlaps the light-emitting element and a third layer that overlaps the second layer,
wherein the third color filter and the third layer are formed from a third colored layer that transmits light having a third wavelength that is different from the first and second wavelengths.

12. A light-emitting device comprising:
a light-emitting element disposed on a surface of a base body;
a first sealing layer that includes a sealing surface that overlaps the light-emitting element and a side end surface that is positioned on an outside of the sealing surface in a plan view and is inclined with respect to the sealing surface, and seals the light-emitting element;
a second sealing layer that covers the first sealing layer; and
a filter layer having a first color filter that overlaps the light-emitting element on a surface of the second sealing layer and a first layer that overlaps a peripheral edge of the side end surface on the sealing surface side on a surface of the second sealing layer,
wherein the first color filter and the first layer are formed from a first colored layer that transmits light having a first wavelength.

13. An electronic apparatus comprising:
the light-emitting device according to claim 1.

14. An electronic apparatus comprising:
the light-emitting device according to claim 2.

15. An electronic apparatus comprising:
the light-emitting device according to claim 3.

16. An electronic apparatus comprising:
the light-emitting device according to claim 4.

17. An electronic apparatus comprising:
the light-emitting device according to claim 5.

18. An electronic apparatus comprising:
the light-emitting device according to claim 6.

19. An electronic apparatus comprising:
the light-emitting device according to claim 7.

20. An electronic apparatus comprising:
the light-emitting device according to claim 12.

21. A light-emitting device comprising:
a light-emitting element corresponding to each of a plurality of pixels in a display region of a substrate, the light-emitting element including a light-emitting layer having a peripheral edge positioned in a peripheral region of the display region in a plan view;
a pixel defining layer formed over the substrate;
a first electrode;
a second electrode, wherein the light-emitting layer is interposed between the first and second electrodes;
a first conductor in the peripheral region, the second electrode electrically connected to the first conductor via a conduction hole of the pixel defining layer;
a second conductor electrically connected to the first conductor, wherein an entire periphery of the peripheral edge of the light-emitting layer overlaps the second conductor; and
a filter layer having a first color filter that overlaps the light-emitting element and a first layer that overlaps the peripheral region of the display region, wherein the first color filter and the first layer are formed from a first colored layer that transmits light having a first wavelength.

* * * * *